(12) United States Patent
Bates et al.

(10) Patent No.: US 9,652,181 B2
(45) Date of Patent: May 16, 2017

(54) LIBRARY APPARATUS INCLUDING A CARTRIDGE MEMORY (CM) DATABASE STORED ON A STORAGE CLOUD

(71) Applicant: International Business Machines Corporation, Armonk, NY (US)

(72) Inventors: Allen K. Bates, Tucson, AZ (US);
Nhan X. Bui, Tucson, AZ (US);
Octaviano G. Gomez, Tucson, AZ (US); Marie L. E. Romero, Tucson, AZ (US); Stephen L. Schwartz, Tucson, AZ (US); Daniel J. Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 498 days.

(21) Appl. No.: 14/149,744

(22) Filed: Jan. 7, 2014

(65) Prior Publication Data
US 2015/0193173 A1 Jul. 9, 2015

(51) Int. Cl.
*G06F 12/00* (2006.01)
*G06F 3/06* (2006.01)

(52) U.S. Cl.
CPC ............ *G06F 3/0686* (2013.01); *G06F 3/067* (2013.01); *G06F 3/0613* (2013.01); *G06F 3/0664* (2013.01)

(58) Field of Classification Search
None
See application file for complete search history.

(56) References Cited

U.S. PATENT DOCUMENTS

| | | | |
|---|---|---|---|
| 6,304,416 B1 | 10/2001 | McAllister et al. | |
| 6,356,803 B1 | 3/2002 | Goodman et al. | |
| 7,743,205 B2 | 6/2010 | Massey et al. | |
| 7,843,663 B2 | 11/2010 | Nave et al. | |
| 8,265,786 B2 | 9/2012 | Jesionowski et al. | |
| 8,589,648 B2 * | 11/2013 | Coney ................. | G06F 11/1456 711/112 |
| 8,949,535 B1 * | 2/2015 | Hunter .................. | G06F 11/073 711/119 |
| 9,111,570 B1 * | 8/2015 | Freitag ................. | G11B 27/024 |
| 9,242,796 B1 * | 1/2016 | Krick ................. | G11B 15/6835 |
| 2003/0110188 A1 | 6/2003 | Howard et al. | |
| 2007/0055686 A1 * | 3/2007 | Findlay ................ | G06Q 10/087 |
| 2009/0028339 A1 * | 1/2009 | Goodman ............... | G06F 21/80 380/278 |

(Continued)

*Primary Examiner* — Tan X Dinh
(74) *Attorney, Agent, or Firm* — Zilka-Kotab, PC

(57) ABSTRACT

In one embodiment, a system includes a storage cloud comprising storage media, a cartridge memory (CM) database stored to the storage media, and a storage controller, wherein the storage controller is configured to communicate with one or more data storage drives located in one or more data storage libraries, each data storage drive being configured to write and/or read data to/from a plurality of data storage cartridges therein, and control the one or more data storage libraries as a single logical library, wherein the CM database includes a plurality of entries, each entry corresponding to a data storage cartridge. In another embodiment, the data storage cartridge includes a data storage medium configured to store more than about 100 MB of data, a physical CM configured to store less than about 100 KB of data, and a visible indicator displayed on an exterior of the housing.

18 Claims, 14 Drawing Sheets

(56) References Cited

U.S. PATENT DOCUMENTS

| | | | |
|---|---|---|---|
| 2010/0046108 A1* | 2/2010 | Anna | G11B 5/09 |
| | | | 360/53 |
| 2010/0254241 A1* | 10/2010 | Aoki | G06F 3/0605 |
| | | | 369/84 |
| 2010/0265606 A1* | 10/2010 | Thompson | G11B 5/86 |
| | | | 360/15 |
| 2010/0265607 A1* | 10/2010 | Thompson | G11B 5/86 |
| | | | 360/15 |
| 2010/0274784 A1 | 10/2010 | Acharya | |
| 2011/0258461 A1 | 10/2011 | Bates | |
| 2012/0030179 A1 | 2/2012 | Kauffman et al. | |
| 2012/0296960 A1 | 11/2012 | Kreuzer et al. | |
| 2014/0347764 A1* | 11/2014 | Miller | G11B 15/689 |
| | | | 360/72.3 |
| 2016/0012256 A1* | 1/2016 | Topham | G06F 21/73 |
| | | | 713/193 |
| 2016/0225402 A1* | 8/2016 | Hikita | G11B 15/66 |

* cited by examiner

LIBRARY APPARATUS INCLUDING A CARTRIDGE MEMORY (CM) DATABASE STORED ON A STORAGE CLOUD

BACKGROUND

The present invention relates to storage systems, and more particularly, this invention relates to a data storage cartridge which has a virtual cartridge memory (CM) that is stored other than on the data storage cartridge.

Automated data storage libraries are known for providing cost effective storage and retrieval of large quantities of data. The data in automated data storage libraries is typically stored on media of data storage cartridges that are, in turn, stored at storage slots or the like inside the library in a fashion that renders the media, and its resident data, accessible for physical retrieval. Such data storage cartridges are commonly termed "removable media." Data storage cartridge media may comprise any type of media on which data may be stored and which may serve as removable media, including but not limited to magnetic media (such as magnetic tape or disks), optical media (such as optical tape or disks), electronic media (such as Electrically Erasable Programmable Read Only Memory (EEPROM), Programmable Read Only Memory (PROM), flash PROM, CompactFlash™, Smartmedia™, Memory Stick™, Solid State Drives (SSDs), etc.), Millipede nanotechnology storage, or other suitable media. An example of a data storage cartridge that is widely employed in automated data storage libraries for mass data storage is a magnetic tape cartridge which is read and written to by a magnetic tape drive.

In addition to data storage media, automated data storage libraries typically comprise data storage drives (such as tape drives, optical drives, SSD drives, etc.) that store data to, and/or retrieve data from, the data storage cartridge media. Further, automated data storage libraries typically comprise I/O stations at which data storage cartridges are supplied or added to, or removed from, the library. The transport of data storage cartridges between data storage slots, data storage drives, and I/O stations is typically accomplished by one or more accessors. Such accessors have grippers for physically retrieving the selected data storage cartridges from the storage slots within the automated data storage library and transporting such cartridges to the data storage drives by moving, for example, in the X- and Y-directions along one or more two-dimensional grids that are configured to access all cartridges and drives.

In an effort to increase storage capacity, deep slot technology allows for storage cells that contain more than a single data storage cartridge. Such storage libraries allow for higher density, or more cartridges stored per square foot. In deep slot libraries, two or more cartridges may be stored in a multi-cartridge deep slot cell, arrayed in series, one behind the other, in tiers ranging from a front-most tier to a rearmost tier.

Cartridge memory (CM) in tape cartridges is typically physical storage media attached to, disposed within, or otherwise available at the tape cartridge. CM conventionally has a finite storage capacity, such as 64 KB, which results in the CM not being used very often when utilizing the tape cartridges. However, if the CM were to have more storage capacity, it could be more widely used and capable of being used in a variety of other ways not typically associated with CM.

BRIEF SUMMARY

In one embodiment, a system includes a storage cloud comprising storage media, a cartridge memory (CM) database stored to the storage media, and a storage controller, wherein the storage controller is configured to communicate with one or more data storage drives located in one or more data storage libraries, each data storage drive being configured to write and/or read data to/from a plurality of data storage cartridges therein, and control the one or more data storage libraries as a single logical library, wherein the CM database includes a plurality of entries, each entry corresponding to a data storage cartridge.

In another embodiment, a data storage cartridge includes a housing configured to store a data storage medium, the data storage medium being configured to store more than about 100 MB of data, a physical CM configured to store less than about 100 KB of data, and a visible indicator displayed on an exterior of the housing, the visible indicator providing at least a cloud link to a location within a storage cloud and a unique identifier.

In yet another embodiment, a method includes receiving, from a plurality of data storage drives, information corresponding to a plurality of data storage cartridges, adding at least some of the information corresponding to the plurality of data storage cartridges to a CM database, and controlling one or more data storage libraries including the plurality of data storage drives as a single logical library.

According to another embodiment, a computer program product for providing cloud-based control of a data storage system includes a computer readable storage medium having program code embodied therewith, the program code readable and/or executable by a processor to receive, from a plurality of data storage drives, information corresponding to a plurality of data storage cartridges, add at least some of the information corresponding to the plurality of data storage cartridges to a CM database, control one or more data storage libraries including the plurality of data storage drives as a single logical library, communicate with the plurality of data storage drives located in the one or more data storage libraries using a cloud interface disposed therein, and organize the plurality of data storage cartridges located in the one or more data storage libraries according to at least one attribute thereof.

Other aspects and embodiments of the present invention will become apparent from the following detailed description, which, when taken in conjunction with the drawings, illustrate by way of example the principles of the invention.

DETAILED DESCRIPTION

Figure 1:
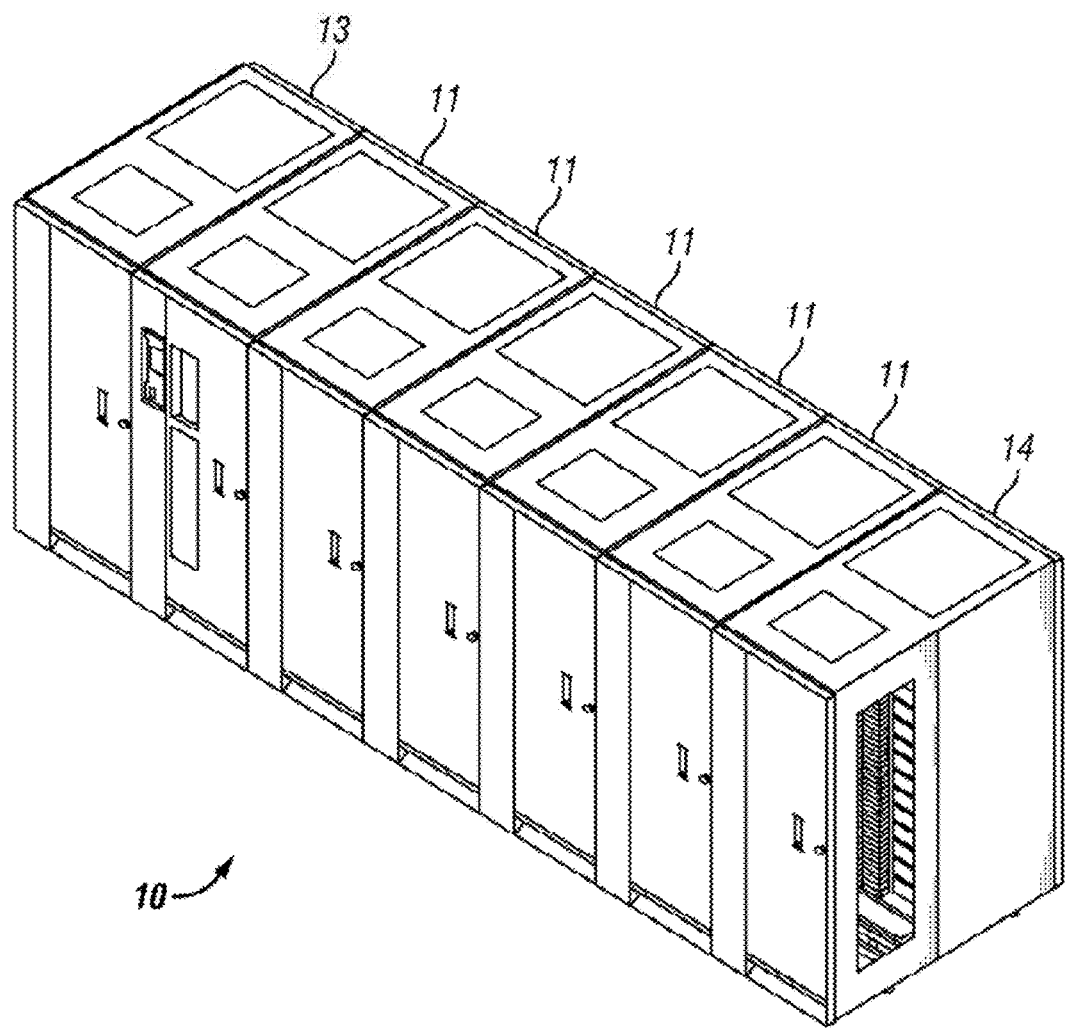
FIG. 1 is a perspective view of an automated data storage library according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several embodiments of a data storage cartridge that utilizes a virtual or cloud cartridge memory (CM) that allows for the storage capacity of a physical CM to be increased with little to no restrictions on the overall size of the virtual CM. This enables vast amounts of data to be stored to the virtual CM, such as user specific formats, error codes, directory entries, and any other data desired to be stored to the virtual CM to provide a personalized storage solution.

In one general embodiment, a system includes a storage cloud comprising storage media, a CM database stored to the storage media, and a storage controller, wherein the storage controller is configured to communicate with one or more data storage drives located in one or more data storage libraries, each data storage drive being configured to write and/or read data to/from a plurality of data storage cartridges therein, and control the one or more data storage libraries as a single logical library, wherein the CM database includes a plurality of entries, each entry corresponding to a data storage cartridge.

In another general embodiment, a data storage cartridge includes a housing configured to store a data storage medium, the data storage medium being configured to store more than about 100 MB of data, a physical CM configured to store less than about 100 KB of data, and a visible indicator displayed on an exterior of the housing, the visible indicator providing at least a cloud link to a location within a storage cloud and a unique identifier.

In yet another general embodiment, a method includes receiving, from a plurality of data storage drives, information corresponding to a plurality of data storage cartridges, adding at least some of the information corresponding to the plurality of data storage cartridges to a CM database, and controlling one or more data storage libraries including the plurality of data storage drives as a single logical library.

According to another general embodiment, a computer program product for providing cloud-based control of a data storage system includes a computer readable storage medium having program code embodied therewith, the program code readable and/or executable by a processor to receive, from a plurality of data storage drives, information corresponding to a plurality of data storage cartridges, add at least some of the information corresponding to the plurality of data storage cartridges to a CM database, control one or more data storage libraries including the plurality of data storage drives as a single logical library, communicate with the plurality of data storage drives located in the one or more data storage libraries using a cloud interface disposed therein, and organize the plurality of data storage cartridges located in the one or more data storage libraries according to at least one attribute thereof.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), a digital versatile disk (DVD), a Blu-Ray disk, an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java. Smalltalk, C++, Python or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic, software logic such as firmware, operating system etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), etc.

Figure 2:
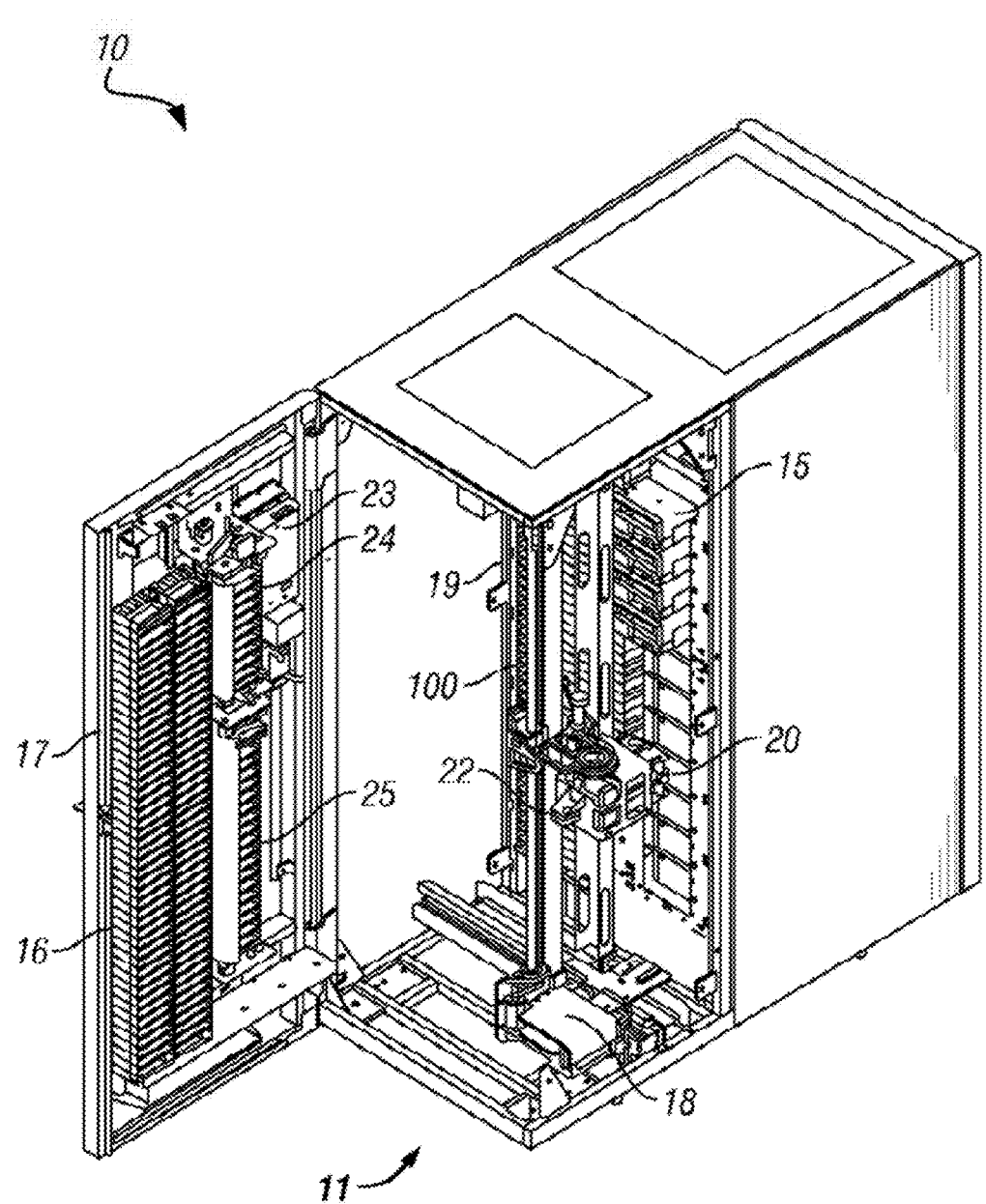
FIG. 2 is a perspective view of a storage frame from the data storage library of FIG. 1.

FIGS. 1-2 illustrate an automated data storage library 10 which stores and retrieves data storage cartridges, containing data storage media (not shown), from multi-cartridge deep slot cells 100 and single cartridge storage slots 16. An example of an automated data storage library which has a similar configuration as that depicted in FIGS. 1-2, and may be implemented with some of the various approaches herein is the IBM 3584 UltraScalable Tape Library. Moreover, it should be noted that references to "data storage media" herein refer to data storage cartridges, and for purposes of the present application, the two terms may be used synonymously.

The library 10 of FIG. 1 comprises a left hand service bay 13, one or more storage frames 11, and right hand service bay 14. As will be discussed in further detail below, a frame may comprise an expansion component of the library. Thus, storage frames may be added or removed to expand or reduce the size and/or functionality of the library. According to different approaches, frames may include additional storage slots, deep slot cells, drives, import/export stations, accessors, operator panels, etc.

FIG. 2 shows an exemplary embodiment of a storage frame 11, which acts as the base frame of the library 10. Moreover, the storage frame 11 illustrated in FIG. 2 is contemplated to be a minimum configuration of the library 10, for which there is only a single accessor 18 (i.e., there are no redundant accessors) and no service bay. However, in other embodiments, a storage frame may include multiple robotic accessors and/or service bays.

Looking to FIG. 2, the library 10 is arranged for accessing data storage media in response to commands from at least one external host system (not shown). The library 10 includes a plurality of storage slots 16 on front wall 17 and a plurality of multi-cartridge deep slot cells 100 on rear wall 19, both of which may be used to storing data storage cartridges that may contain data storage media. According to one approach, the storage slots 16 are configured to store a single data storage cartridge, and the multi-cartridge deep slot cells 100 are configured to store a plurality of data storage cartridges. In a preferred approach, the multi-cartridge deep slot cells may be arranged in sequential order of tiers from front to rear.

With continued reference to FIG. 2, the storage frame 11 of the library 10 also includes at least one data storage drive 15, e.g., for reading and/or writing data with respect to the data storage media. Additionally, a first accessor 18 may be used to transport data storage media between the plurality of storage slots 16, the multi-cartridge deep slot cells, and/or the data storage drive(s) 15. According to various approaches, the data storage drives 15 may be optical disk drives, magnetic tape drives, or other types of data storage drives as are used to read and/or write data with respect to the data storage media.

As illustrated, the storage frame 11 may optionally include an operator panel 23 or other user interface, such as a web-based interface, which allows a user to interact with the library 10. The storage frame 11 may also optionally comprise an upper I/O station 24 and/or a lower I/O station 25, thereby allowing data storage cartridges to be added (e.g., inserted) to the library inventory and/or removed from the library without disrupting library operation. Furthermore, the library 10 may have one or more storage frames 11, each having storage slots 16, preferably accessible by the first accessor 18.

As described above, the storage frames 11 may be configured with different components depending upon the intended function. One configuration of storage frame 11 may comprise storage slots 16 and/or multi-cartridge deep slot cells 100, data storage drive(s) 15, and other optional components to store and retrieve data from the data storage cartridges. However, in another approach, a storage frame 11 may include storage slots 16 and/or multi-cartridge deep slot cells 100 and no other components. The first accessor 18 may have a gripper assembly 20, e.g., for gripping one or more data storage media, in addition to having a bar code and/or quick response (QR) code scanner 22 or other reading system, such as a cartridge memory reader or similar system mounted on the gripper assembly 20, to "read" identifying information about the data storage media.

Figure 3:
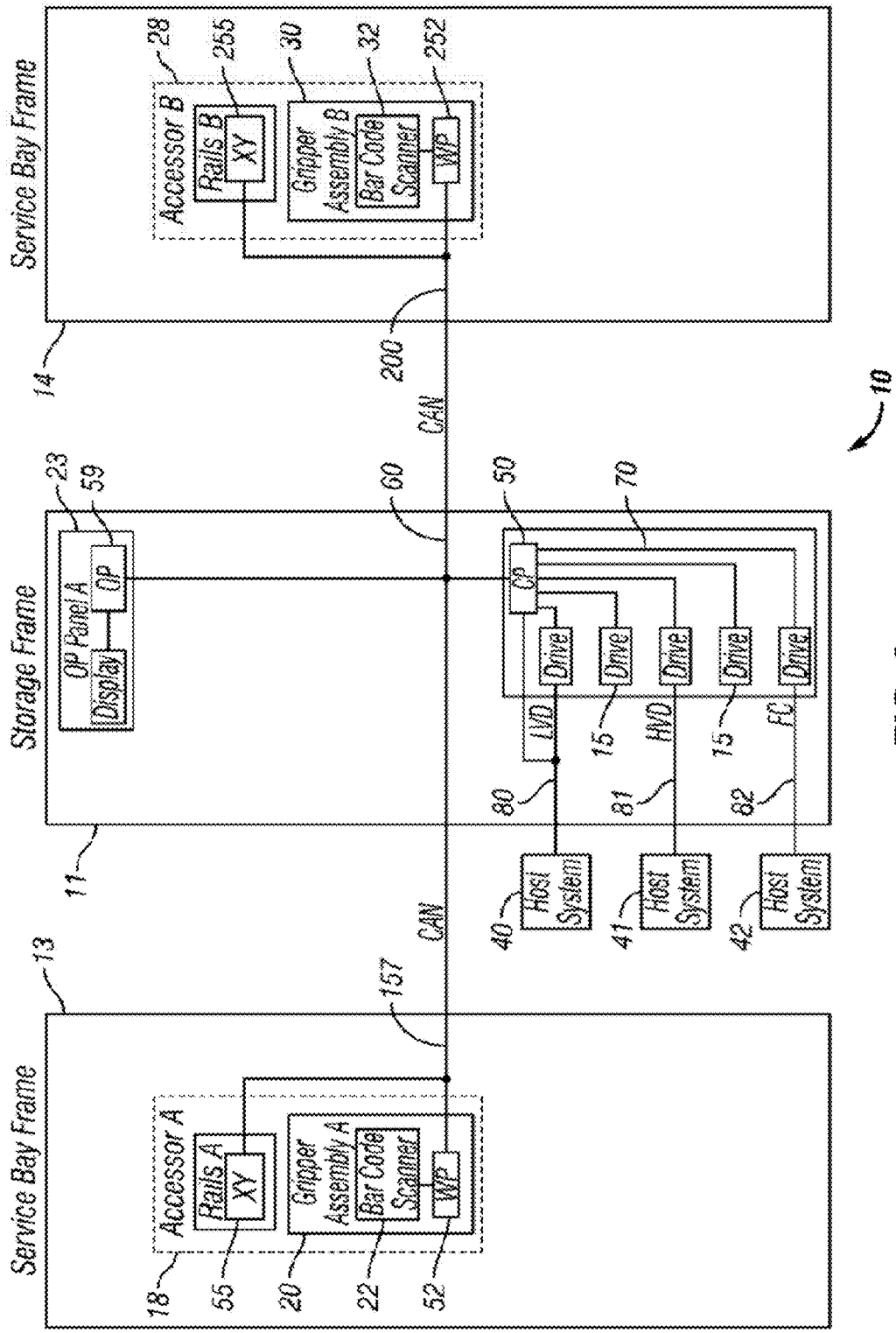
FIG. 3 is a block diagram of an automated data storage library according to one embodiment.

FIG. 3 depicts an automated data storage library 10, in accordance with one embodiment. As an option, the present automated data storage library 10 may be implemented in conjunction with features from any other embodiment listed herein, such as those described with reference to the other FIGS. Of course, however, such automated data storage library 10 and others presented herein may be used in various applications and/or in permutations which may or may not be specifically described in the illustrative embodiments listed herein. Further, the automated data storage library 10 presented herein may be used in any desired environment. Thus FIG. 3 (and the other Figures) should be deemed to include any and all possible permutations.

Referring now to FIG. 3, the automated data storage library 10 as described in reference to FIGS. 1 and 2, is depicted according to one embodiment. According to one approach, the library 10 may employ a controller, e.g., arranged as a distributed system of modules with a plurality of processor nodes as will be discussed in further detail below.

According to an exemplary embodiment, an automated data storage library which may implement the distributed system depicted in the block diagram of FIG. 3, and/or other approaches presented herein, is the IBM 3584 UltraScalable Tape Library. For a fuller understanding of a distributed control system incorporated in an automated data storage library, refer to U.S. Pat. No. 6,356,803, which is entitled "Automated Data Storage Library Distributed Control System," and is hereby incorporated by reference.

While the automated data storage library 10 has been described as employing a distributed control system, various other approaches described and/or suggested herein may be implemented in automated data storage libraries regardless of control configuration, such as, but not limited to, an automated data storage library having one or more library controllers that are not distributed, as that term is defined in U.S. Pat. No. 6,356,803.

Referring still to FIG. 3, the library 10 may have one or more storage frames 11, a left hand service bay 13 and a right hand service bay 14. The left hand service bay 13 is shown with a first accessor 18, where, as discussed above, the first accessor 18 may include a gripper assembly 20 and/or a reading system 22 to "read" identifying information about the data storage media depending on the desired embodiment, such as reading a bar code, a QR code, or other optically-recognizable information. Furthermore, the right hand service bay 14 is shown having a second accessor 28, which includes a gripper assembly 30 and may also include a reading system 32 to "read" identifying information about the data storage media.

According to one approach, in the event of a failure or other unavailability of the first accessor 18, or its gripper assembly 20, etc., the second accessor 28 may perform some or all of the functions of the first accessor 18. Thus in different approaches, the two accessors 18, 28 may share one or more mechanical paths, they may have completely independent mechanical paths, or combinations thereof. In one example, the accessors 18, 28 may have a common horizontal rail with independent vertical rails to travel therealong. Moreover, it should be noted that the first and second accessors 18, 28 are described as first and second for descriptive purposes only and this description is not meant to limit either accessor to an association with either the left hand service bay 13, or the right hand service bay 14.

In an exemplary embodiment which is in no way intended to limit the invention, the first and second accessors 18, 28 may preferably move their grippers in at least two directions, called the horizontal X-direction and vertical Y-direction, e.g., to retrieve and grip, deliver and release, load and unload, etc. the data storage cartridge at the storage slots 16, multi-cartridge deep slot cells 100, data storage drives 15, etc.

With continued reference to FIG. 3, library 10 receives commands from one or more host systems 40, 41, 42. The host systems 40, 41, 42, such as host servers, communicate with the library directly, e.g., on path 80, through one or more control ports (not shown), or through one or more data storage drives 15 on paths 81, 82. Thus, in different approaches, the host systems 40, 41, 42 may provide commands to access particular data storage cartridges and move the cartridges, for example, between the storage slots 16 and the data storage drives 15. The commands are typically logical commands identifying the cartridges or cartridge media, and/or logical locations for accessing the media. Furthermore, it should be noted that the terms "commands" and "work requests" are used interchangeably herein to refer to such communications from the host system 40, 41, 42 to the library 10 as are intended to result in accessing particular data storage media within the library 10 depending on the desired approach.

According to one embodiment, the library 10 may be controlled by a library controller. Moreover, in various approaches, the library controller may include a distributed control system receiving the logical commands from hosts, determining the required actions, and/or converting the actions to physical movements of the first and/or second accessor 18, 28. In another approach, the distributed control system may have a plurality of processor nodes, each having one or more computer processors. According to one example of a distributed control system, a communication processor node 50 may be located in a storage frame 11. The communication processor node provides a communication link for receiving the host commands, either directly or through the drives 15, via at least one external interface, e.g., coupled to line 80.

Still referring to FIG. 3, the communication processor node 50 may additionally provide a communication link 70 for communicating with the data storage drives 15. As illustrated, the communication processor node 50 may preferably be located in the storage frame 11, e.g., close to the data storage drives 15. Furthermore, one or more additional work processor nodes may be provided to form an exemplary distributed processor system, which may comprise, e.g., a work processor node 52 located at first accessor 18, and that is coupled to the communication processor node 50 via a network 60, 157. According to different approaches, each work processor node may respond to received commands that are broadcast thereto from any communication processor node, and the work processor nodes may also direct the operation of the accessors, e.g., providing move commands. An XY processor node 55 may be provided and may be located at an XY system of first accessor 18. As illustrated, the XY processor node 55 is coupled to the network 60, 157, and is responsive to the move commands, operating the XY system to position the gripper assembly 20.

Also, an operator panel processor node 59 may be provided at the optional operator panel 23 for providing an interface for communicating between the operator panel and the communication processor node 50, the work processor nodes 52, 252, and the XY processor nodes 55, 255.

A network 60, for example comprising a common bus, is provided, coupling the various processor nodes. The network may comprise a robust wiring network, such as the commercially available Controller Area Network (CAN) bus system, which is a multi-drop network, having a standard access protocol and wiring standards, for example, as defined by CiA, the CAN in Automation Association, Am Weich Selgarten 26, D-91058 Erlangen, Germany. Other networks, such as Ethernet, or a wireless network system, such as RF or infrared, may be employed in the library as is known to those of skill in the art. In addition, multiple independent networks may also be used to couple the various processor nodes.

As illustrated in FIG. 3, the communication processor node 50 is coupled to each of the data storage drives 15 of a storage frame 11, via lines 70, and are thereby communicating with the drives 15 and with host systems 40, 41, 42. Alternatively, the host systems 40, 41, 42 may be directly coupled to the communication processor node 50, at input 80 for example, or to control port devices (not shown) which connect the library to the host system(s) with a library interface similar to the drive/library interface. As is known to those of skill in the art, various communication arrangements may be employed for communication with the hosts and with the data storage drives. In the example of FIG. 3, host connections 80 and 81 are intended to be Low-Voltage Differential (LVD) and High Voltage Differential (HVD) SCSI busses, respectively. In one embodiment, host connections 80 and 81 are Serial Attached SCSI (SAS). However, bus 82 comprises an example of a Fibre Channel (FC) bus which is a high speed serial data interface, allowing transmission over greater distances than the SCSI bus systems.

According to some approaches, the data storage drives 15 may be in close proximity to the communication processor node 50, and may employ a short distance communication scheme, such as SCSI, or a serial connection, such as RS-422. Thus the data storage drives 15 may be individually coupled to the communication processor node 50 by means of lines 70. Alternatively, the data storage drives 15 may be coupled to the communication processor node 50 through one or more networks, such as a common bus network.

Furthermore, additional storage flames 11 may be provided, whereby each is preferably coupled to the adjacent storage frame. According to various approaches, any of the additional storage frames 11 may include communication processor nodes 50, storage slots 16, data storage drives 15, networks 60, etc.

Moreover, as described above, the automated data storage library 10 may comprise a plurality of accessors. A second accessor 28, for example, is shown in a right hand service bay 14 of FIG. 3. The second accessor 28 may include a gripper assembly 30 for accessing the data storage media, and an XY system 255 for moving the second accessor 28. The second accessor 28 may run on the same horizontal mechanical path as the first accessor 18, and/or on an adjacent (e.g., separate) path. Moreover the illustrative control system additionally includes an extension network 200 which forms a network coupled to network 60 of the storage frame(s) 11 and to network 157 of left hand service bay 13.

In FIG. 3 and the accompanying description, the first and second accessors are associated with the left hand service bay 13 and the right hand service bay 14 respectively. However, this is for illustrative purposes and there may not be an actual association. Thus, according to another approach, network 157 may not be associated with the left hand service bay 13 and network 200 may not be associated with the right hand service bay 14. Moreover, depending on the design of the library, it may not be necessary to have a left hand service bay 13 and/or a right hand service bay 14 at all.

An automated data storage library 10 typically comprises one or more controllers to direct the operation of the automated data storage library. Moreover, host computers and data storage drives typically include similar controllers. A library controller may take many different forms and may comprise, for example, but is not limited to, an embedded system, a distributed control system, a personal computer, a workstation, etc. Essentially, the term "library controller" as used herein is intended in its broadest sense as a device that contains at least one computer processor, as such term is defined herein.

Figure 4:
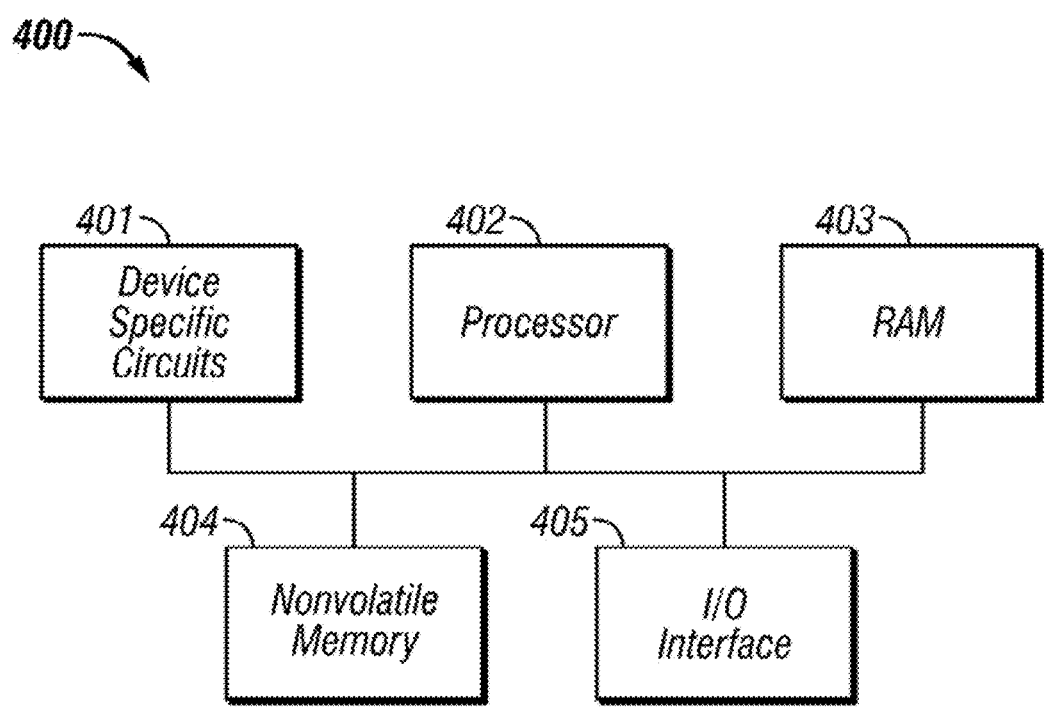
FIG. 4 is a block diagram depicting a controller configuration according to one embodiment.

Referring now to FIG. 4, a typical controller 400 is shown with a processor 402, Random Access Memory (RAM) 403, nonvolatile memory 404, device specific circuits 401, and I/O interface 405. Alternatively, the RAM 403 and/or nonvolatile memory 404 may be included in the processor 402 as could the device specific circuits 401 and I/O interface 405. The processor 402 may comprise, for example, an off-the-shelf microprocessor, custom processor, Field Programmable Gate Array (FPGA), Application Specific Integrated Circuit (ASIC), discrete logic, etc. The RAM 403 is typically used to hold variable data, stack data, executable instructions, etc.

According to various approaches, the nonvolatile memory 404 may comprise any type of nonvolatile memory such as, but not limited to, Electrically Erasable Programmable Read Only Memory (EEPROM), flash Programmable Read Only Memory (PROM), battery backup RAM, hard disk drives, etc. However, the nonvolatile memory 404 is typically used to hold the executable firmware and any nonvolatile data. Moreover, the I/O interface 405 comprises a communication interface that allows the processor 402 to communicate with devices external to the controller. Examples may comprise, but are not limited to, serial interfaces such as RS-232, USB (Universal Serial Bus) or Small Computer Systems Interface (SCSI). The device specific circuits 401 provide additional hardware to enable the controller 400 to perform unique functions including, but not limited to, motor control of a cartridge gripper, motion control of an accessor, etc. Moreover, the device specific circuits 401 may include electronics that provide, by way of example but not limitation, Pulse Width Modulation (PWM) control. Analog to Digital Conversion (ADC), Digital to Analog Conversion (DAC), etc. In addition, all or part of the device specific circuits 401 may reside outside the controller 400.

While the automated data storage library 10 is described as employing a distributed control system, the various approaches described and/or suggested herein may be implemented in various automated data storage libraries regardless of control configuration, including, but not limited to, an automated data storage library having one or more library controllers that are not distributed. Moreover, a library controller may comprise one or more dedicated controllers of a library, depending on the desired embodiment. For example, there may be a primary controller and a backup controller. In addition, a library controller may comprise one or more processor nodes of a distributed control system. According to one example, communication processor node 50 (e.g., of FIG. 3) may comprise the library controller while the other processor nodes (if present) may assist the library controller and/or may provide backup or redundant functionality. In another example, communication processor node 50 and work processor node 52 may work cooperatively to form the library controller while the other processor nodes (if present) may assist the library controller and/or may provide backup or redundant functionality. Still further, all of the processor nodes may comprise the library controller. According to various approaches described and/or suggested herein, a library controller may have a single processor or controller, or it may include multiple processors or controllers.

Figure 5A:
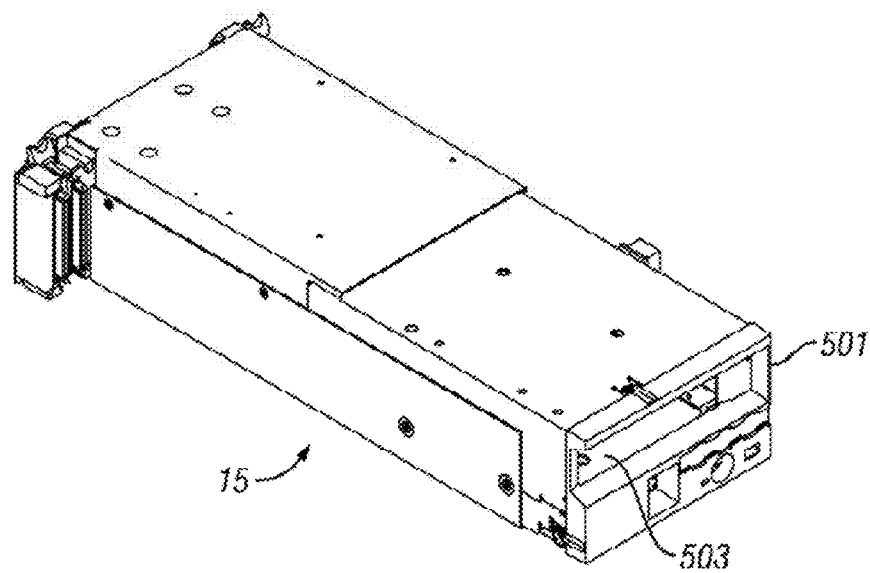
FIG. 5A is a frontal perspective view of a data storage drive according to one embodiment.
Figure 5B:
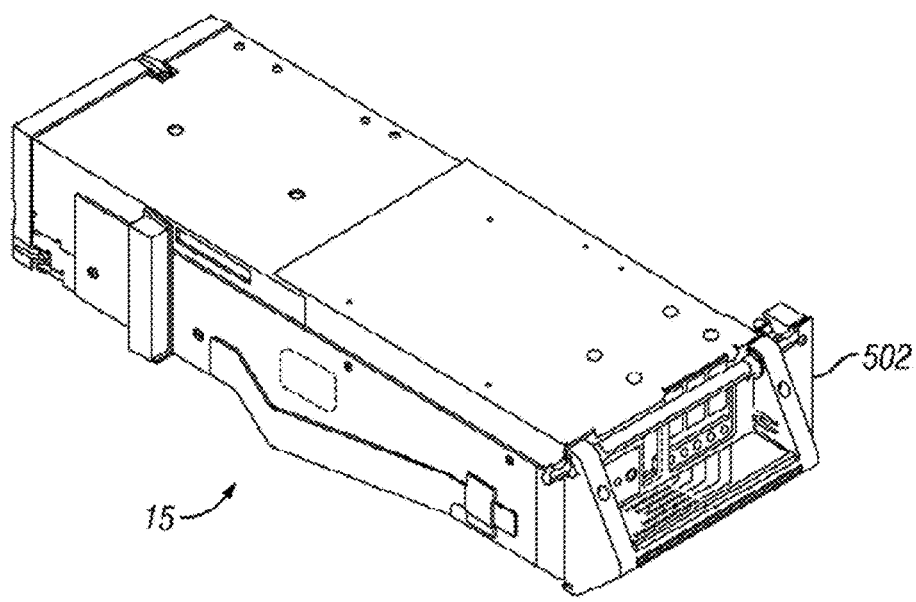
FIG. 5B is a rear perspective view of the data storage drive of FIG. 5A.

FIGS. 5A-5B illustrate the front 501 and rear 502 views of a data storage drive 15, according to one embodiment. In the example depicted in FIGS. 5A-5B, the data storage drive 15 comprises a hot-swap drive canister, which is in no way intended to limit the invention. In fact, any configuration of data storage drive may be used whether or not it includes a hot-swap canister. As discussed above, a data storage drive 15 is used to read and/or write data with respect to the data storage media, and may additionally communicate with a memory which is separate from the media, and is located within the cartridge. Thus, according to one approach, a data storage cartridge may be placed into the data storage drive 15 at opening 503.

Figure 6:
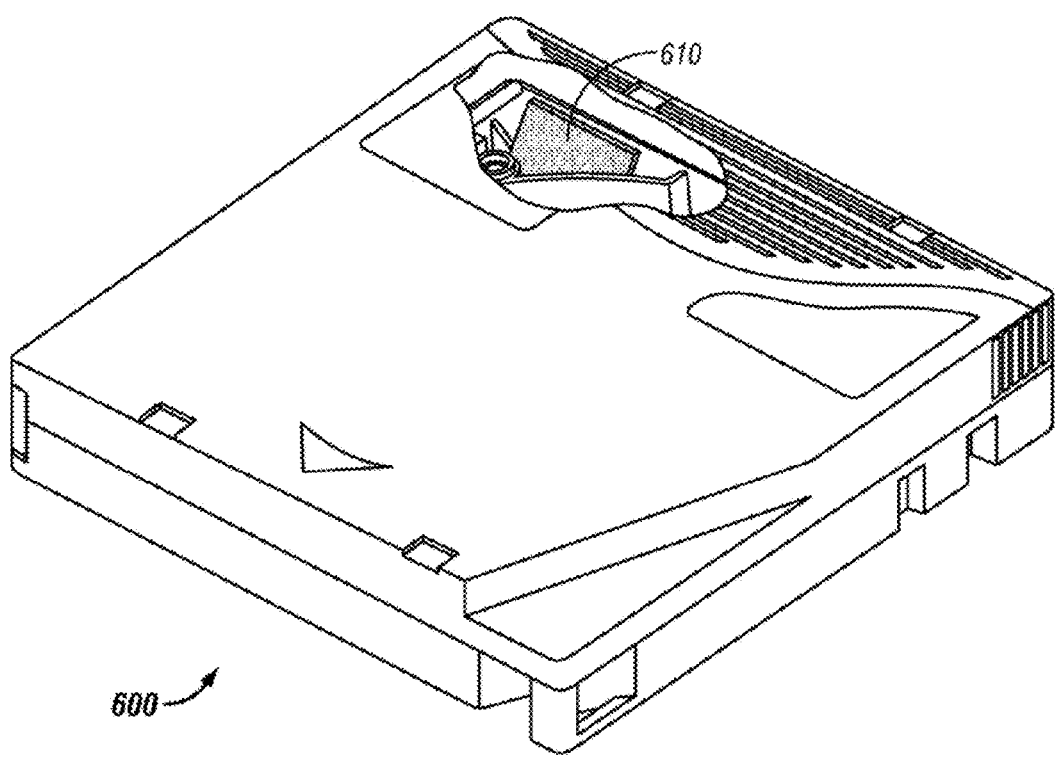
FIG. 6 is perspective view of a data storage cartridge having a cutaway portion, according to one embodiment.

Furthermore, FIG. 6 illustrates an embodiment of a data storage cartridge 600 with a cartridge memory (CM) 610 shown in a cutaway portion of the Figure, which is in no way intended to limit the invention. In fact, any configuration of data storage cartridge may be used whether or not it comprises a CM. According to various approaches, media of the data storage cartridge media may include any type of media on which data may be stored, including but not limited to magnetic media, e.g., magnetic tape, disks, etc.; optical media, e.g., optical tape, disks, etc.; electronic media, e.g., PROM, EEPROM, flash PROM, CompactFlash™, Smartmedia™, Memory Stick™, etc.; etc., or other suitable media. Moreover, an example of a data storage cartridge that is widely employed in automated data storage libraries for mass data storage is a magnetic tape cartridge in which the media is magnetic tape.

The CM 610 included with the data storage cartridge 600 is more fully described, in one embodiment, in U.S. Pat. No. 6,304,416, issued Oct. 16, 2001.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for loadbalancing between clouds).

A cloud computing environment is service oriented with a focus on statelessness, low coupling, modularity, and semantic interoperability. At the heart of cloud computing is an infrastructure comprising a network of interconnected nodes.

Figure 7:
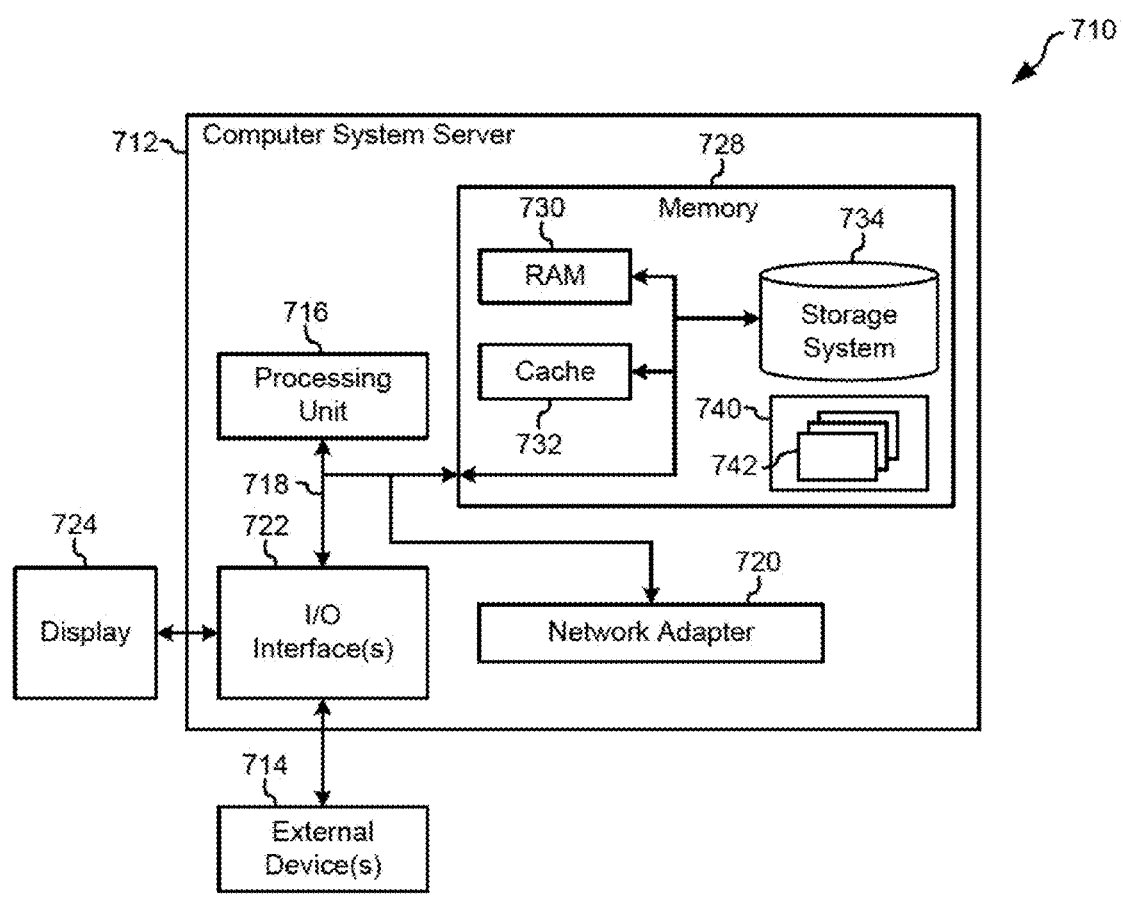
FIG. 7 depicts a cloud computing node, according to one embodiment.

Referring now to FIG. 7, a schematic of an example of a cloud computing node is shown. Cloud computing node 710 is only one example of a suitable cloud computing node and is not intended to suggest any limitation as to the scope of use or functionality of embodiments of the invention described herein. Regardless, cloud computing node 710 is capable of being implemented and/or performing any of the functionality set forth hereinabove.

In cloud computing node 710 there is a computer system/server 712, which is operational with numerous other general purpose or special purpose computing system environments or configurations. Examples of well-known computing systems, environments, and/or configurations that may be suitable for use with computer system/server 712 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 712 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 712 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 7, computer system/server 712 in cloud computing node 710 is shown in the form of a general-purpose computing device. The components of computer system/server 712 may include, but are not limited to, one or more processors or processing units 716, a system memory 728, and a bus 718 that couples various system components including system memory 728 to processor 716.

Bus 718 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus. Video Electronics Standards Association (VESA) local bus, and Peripheral Component Interconnects (PCI) bus.

Computer system/server 712 typically includes a variety of computer system readable media. Such media may be any available media that is accessible by computer system/server 712, and it includes both volatile and non-volatile media, removable and non-removable media.

System memory 728 can include computer system readable media in the form of volatile memory, such as random access memory (RAM) 730 and/or cache memory 732. Computer system/server 712 may further include other removable/non-removable, volatile/non-volatile computer system storage media. By way of example only, storage system 734 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM, Blu-Ray (BD)-ROM, or other optical media can be provided. In such instances, each can be connected to bus 718 by one or more data media interfaces. As will be further depicted and described below, memory 728 may include at least one program product having a set (e.g., at least one) of program modules that are configured to carry out the functions of embodiments of the invention.

Program/utility 740, having a set (at least one) of program modules 742, may be stored in memory 728 by way of example, and not limitation, as well as an operating system, one or more application programs, other program modules, and program data. Each of the operating system, one or more application programs, other program modules, and program data or some combination thereof, may include an implementation of a networking environment. Program modules 742 generally carry out the functions and/or methodologies of embodiments of the invention as described herein.

Computer system/server 712 may also communicate with one or more external devices 714 such as a keyboard, a pointing device, a display 724, etc.; one or more devices that enable a user to interact with computer system/server 712; and/or any devices (e.g., network card, modem, etc.) that enable computer system/server 712 to communicate with one or more other computing devices. Such communication can occur via Input/Output (I/O) interfaces 722. Still yet, computer system/server 712 can communicate with one or more networks such as a local area network (LAN), a general wide area network (WAN), and/or a public network (e.g., the Internet) via network adapter 720. As depicted, network adapter 720 communicates with the other components of computer system/server 712 via bus 718. It should be understood that although not shown, other hardware and/or software components could be used in conjunction with computer system/server 712. Examples, include, but are not limited to: microcode, device drivers, redundant processing units, external disk drive arrays, redundant array of independent disks (RAID) systems, tape drives, and data archival storage systems, etc.

Figure 8:
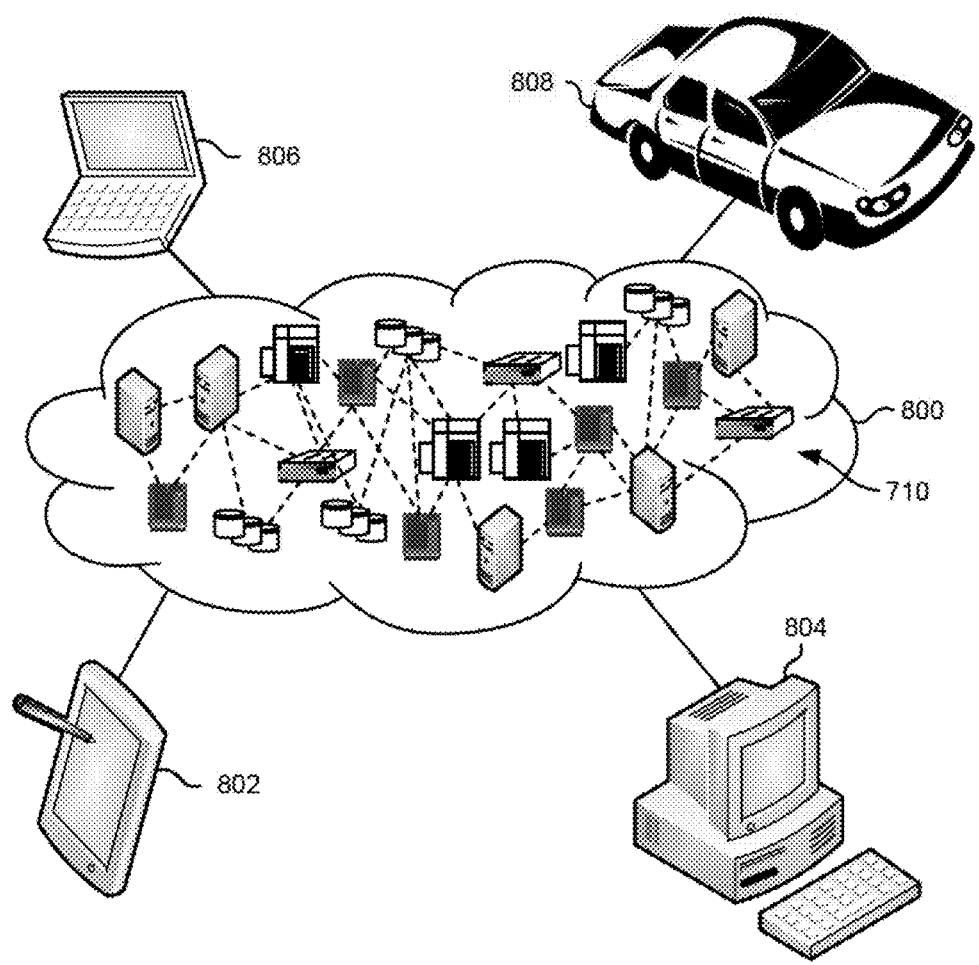
FIG. 8 depicts a cloud computing environment, according to one embodiment.

Referring now to FIG. 8, illustrative cloud computing environment 800 is depicted. As shown, cloud computing environment 800 comprises one or more cloud computing nodes 710 with which local computing devices used by cloud consumers, such as, for example, personal digital assistant (PDA) or cellular telephone 802, desktop computer 804, laptop computer 806, and/or automobile computer system 808 may communicate. Nodes 710 may communicate with one another. They may be grouped (not shown) physically or virtually, in one or more networks, such as Private, Community, Public, or Hybrid clouds as described hereinabove, or a combination thereof. This allows cloud computing environment 800 to offer infrastructure, platforms and/or software as services for which a cloud consumer does not need to maintain resources on a local computing device. It is understood that the types of computing devices 802-808 shown in FIG. 8 are intended to be illustrative only and that computing nodes 710 and cloud computing environment 800 may communicate with any type of computerized device over any type of network and/or network addressable connection (e.g., using a web browser).

Figure 9:
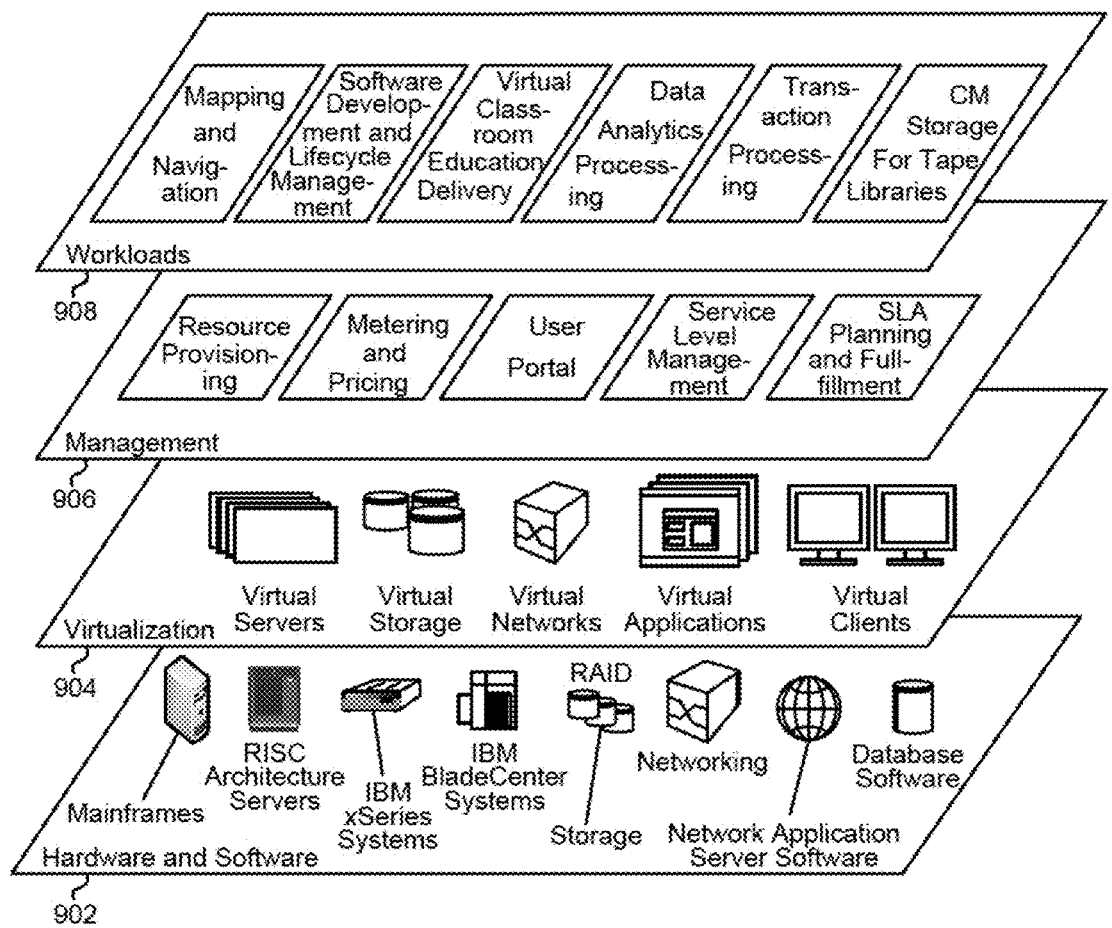
FIG. 9 depicts abstraction model layers, according to one embodiment.

Referring now to FIG. 9, a set of functional abstraction layers provided by cloud computing environment 800 (FIG. 8) is shown. It should be understood in advance that the components, layers, and functions shown in FIG. 9 are intended to be illustrative only and embodiments of the invention are not limited thereto. As depicted, the following layers and corresponding functions are provided.

Hardware and software layer 902 includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer 904 provides an abstraction layer from which the following examples of virtual entities may be provided: virtual servers; virtual storage; virtual networks, including virtual private networks; virtual applications and operating systems; and virtual clients.

In one example, management layer 906 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 908 provides examples of functionality for which the cloud computing environment may be utilized. Examples of workloads and functions which may be provided from this layer include: mapping and navigation; software development and lifecycle management; virtual classroom education delivery; data analytics processing; transaction processing; CM storage for a plurality of data storage cartridges in one or more automated data storage libraries; etc.

Figure 10A:
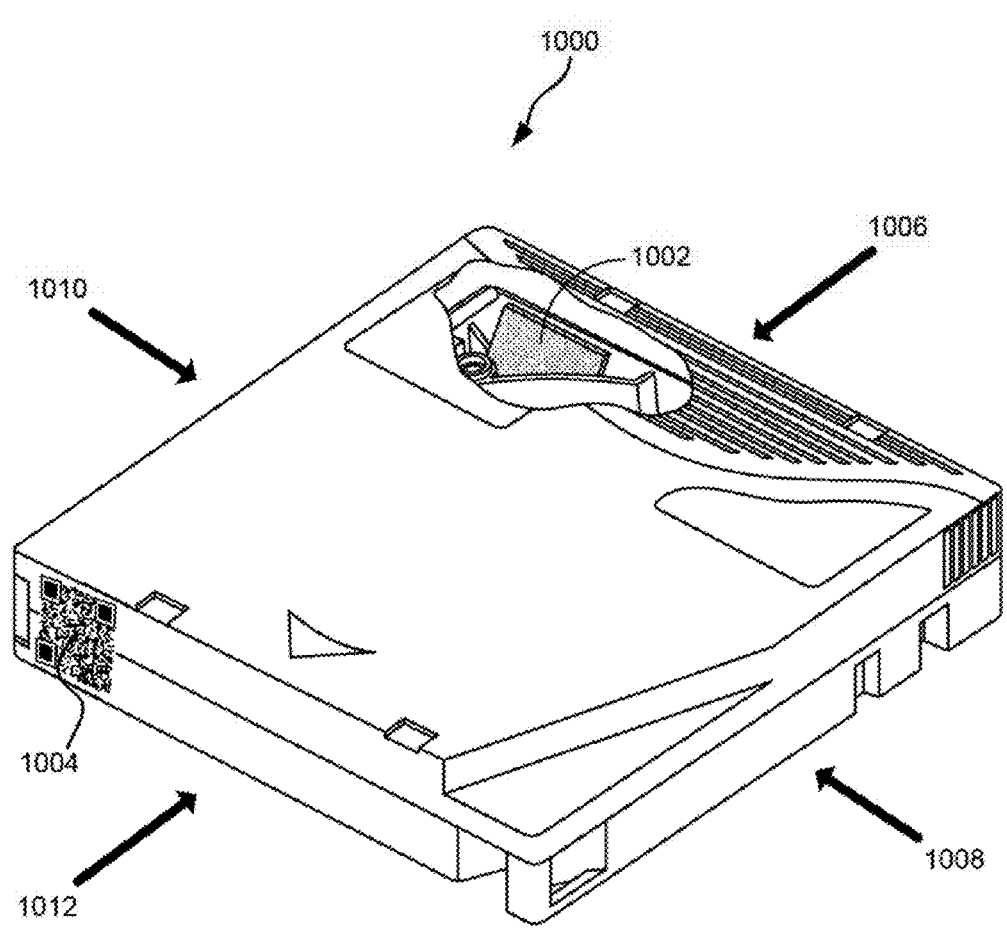
FIG. 10A shows a perspective view of a data storage cartridge according to one embodiment.
Figure 10B:
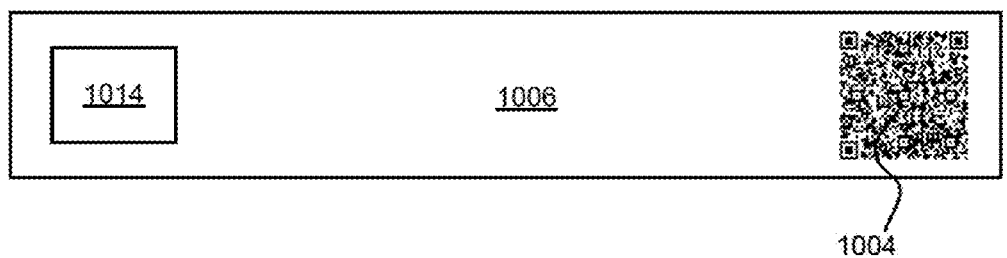
FIG. 10B shows a rear view of a data storage cartridge according to one embodiment.

Now referring to FIGS. 10A-10B, a data storage cartridge 1000 is shown having a housing 1016 that has a front side 1012 which is inserted into a data storage drive for reading and/or writing data from/to a medium within the data storage cartridge 1000, a rear side 1006 facing out of a data storage drive when inserted therein, a left side 1008 and a right side 1010 opposite the left side 1008. The housing 1016 is configured to support, house, and/or protect the medium, and allow reading and/or writing of the medium by a particular data storage drive. In one embodiment, the data storage cartridge 1000 may be configured to allow more data than that which is able to be stored in a conventional CM 1002 to be stored, such as in a cloud or some other remote or local storage network.

In order to provide for this capability, according to one embodiment, a data storage cartridge's CM 1002 may include a link pointing to a particular location in a storage cloud where data regarding the data storage cartridge 1000 may be stored without any constraint on the amount of data stored thereto (regardless of the actual size of the CM 1002 as long as it is large enough to store the cloud link). In another embodiment, a visible indicator 1004 may be included on an exterior surface of the data storage cartridge 1000 which conveys the cloud link and/or contents of the CM 1002 (and possibly additional data).

The visible indicator 1004 may be any combination of symbol(s), code(s), image(s), text, etc., that is visible and interpretable to render the cloud link therefrom, such as a quick response (QR) code (as shown in FIGS. 10A-10B), a bar code, an alphanumeric string representing the location, a MAC or IP address, etc. In this way, data regarding the data storage cartridge 1000 which may previously have been stored in the CM 1002 may be virtualized (and expanded) in the storage cloud, freeing the storage capacity of the virtual CM from its typical 64 KB size constraint as a physical CM 1002.

As shown in FIG. 10A, the visible indicator 1004 may be displayed on an exterior of the data storage cartridge 1000. In a preferred embodiment, the visible indicator 1004 may be displayed on a rear side 1006 of the data storage cartridge 1000, as shown in FIG. 10B.

In one approach, the CM 1002 (and possibly additional data) may be implemented in a wirelessly accessible apparatus, such as a radio frequency identification (RFID) tag 1014 or chip, so that data stored in the CM 1002 (and possibly additional data) may be read by another RFID device, such as a RFID reader, positioned within a transmission range of the RFID tag 1014, as would be understood by one of skill in the art. The RFID tag 1014 may be passive or active, and may include the unique cloud link such that the RFID reader is capable of ascertaining the data stored about the data storage cartridge 1000 from the storage cloud.

The CM 1002 (and possibly additional data) may be implemented as any other storage and/or transmission apparatus capable of providing data from the CM 1002 remotely, as would be understood by one of skill in the art upon reading the present descriptions, such as a radio frequency (RF) transmitter, a Bluetooth link, a near field communication (NFC) chip, etc.

According to one embodiment, by accessing the unique cloud link stored in the CM 1002, the RFID tag 1014, and/or the visible indicator 1004, the location where information corresponding to the data storage cartridge 1000 is stored in the storage cloud may be accessed. This may be a specific directory, file, database, etc., within the broader storage cloud, e.g., a cloud CM, which is an extension of the physical CM 1002. This allows a user to access the cloud CM for the data storage cartridge 1000, and to tailor, modify, adapt, and/or change the data corresponding to the data storage cartridge 1000, such as a format of the contents of the cloud CM to suit the user's needs, requirements, desires, etc. In one approach, the cloud CM may be encrypted for security.

The cloud CM may include any desired information corresponding to and/or describing the data storage cartridge 1000.

Figure 11:
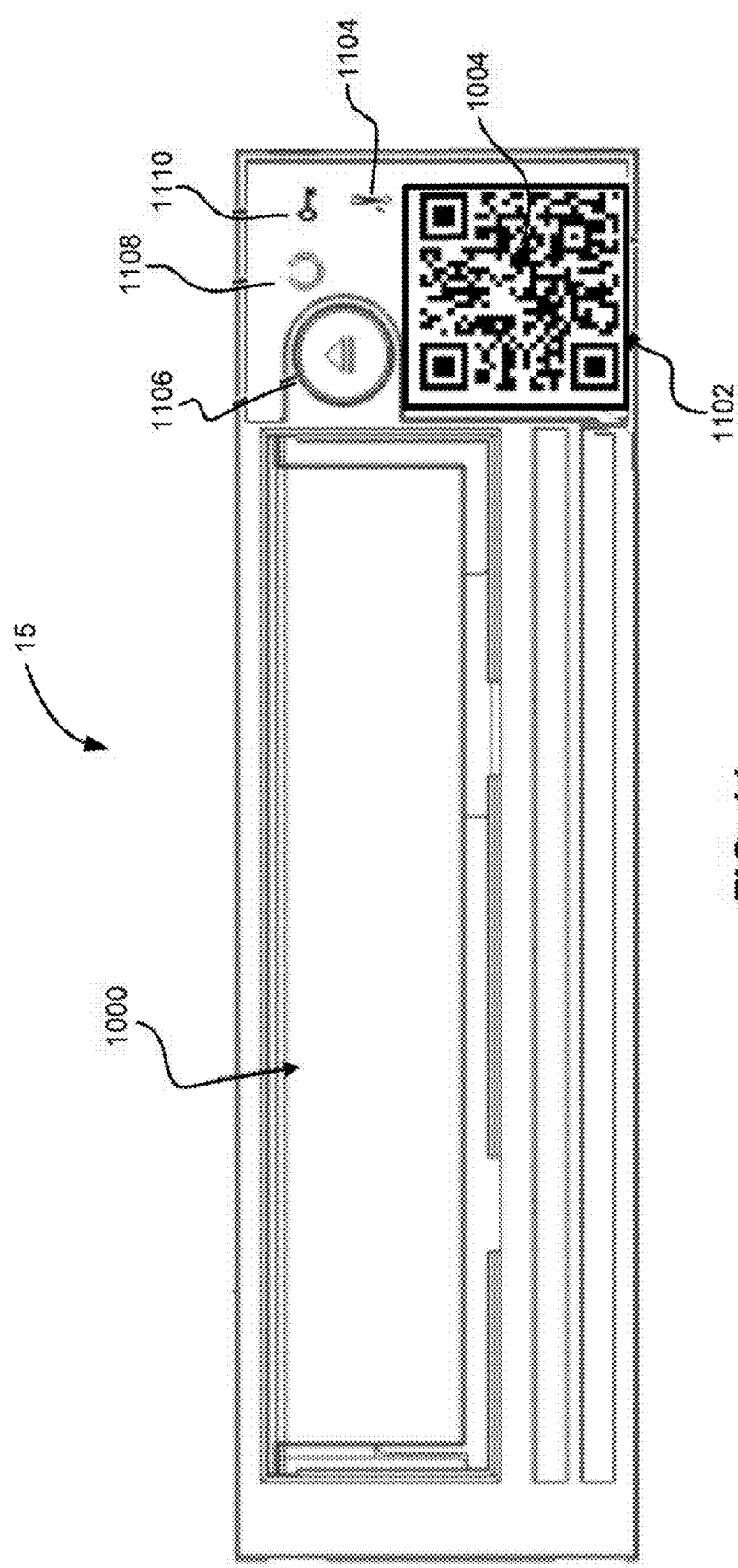
FIG. 11 shows a data storage drive according to one embodiment.

FIG. 11 shows a front side of a data storage drive 15 for accessing data from a tape housed within the data storage cartridge 1000 in one embodiment. The data storage drive 15 includes, in one embodiment, a fault light 1104 (which may be a LED), an eject button 1106, a ready light 1108 (which may be a LED), an encrypt light 1110 (which may be a LED), and a display 1102 configured to display the visible indicator 1004, such as a QR code (as shown) or some other visual indictor configured to relay information about the data storage cartridge 1000 inserted in the data storage drive 15, such as at least the cloud link to the specific cloud CM within the broader storage cloud.

The display 1102 may be of a type known in the art capable of displaying information, such as a LED, a LCD, etc. In one preferred embodiment, the display 1102 may comprise a Ferro-electric Liquid Crystal Display (FLCD) which is configured for camera scanning, smart-phone scanning, iPad™ scanning, etc., for access by mobile devices to the specific cloud CM corresponding to the data storage cartridge 1000 within the broader storage cloud.

In a more specific embodiment, a bistable Ferro-electric Liquid Crystal Display (FLCD) which has a plurality of bits, each bit configured for being dark or light (black or white). Furthermore, information displayed on a bistable FLCD is not changed even when power is lost to the display, and color is not necessary for a QR code, bar code, etc. Power is only needed by the FLCD to change (not maintain) the bits of the display, because the molecules which form the FLCD snap to one orientation or another (light and dark) depending on an applied voltage, and that orientation is held even after the applied voltage is removed. The applied voltage is only used for changing the orientation of the FLCD molecules, and not necessary for maintaining that orientation. This makes the FLCD a very useful visual display and user interface for display of the visible indicator 1004, which changes each time a different data storage cartridge 1000 is inserted in the data storage drive 15.

Referring again to FIGS. 10A-10B, this (virtual) cloud CM corresponding to the data storage cartridge 1000 enables exciting solutions tailored to individual users and customers. The cloud CM corresponding to the data storage cartridge 1000 (which is capable of storing vastly more information about the data storage cartridge 1000 than the physical CM 1002) may include some or all data storage cartridge identifying information, along with self-help, tech-support, sales information, etc., along with an actual directory or index of the data storage cartridge 1000 itself. In this way, the visible indicator 1004 (and/or link in the physical CM 1002) may be a totally comprehensive link.

In a further embodiment, the cloud CM corresponding to the data storage cartridge 1000 may include some or all meta-data relevant to the individual data storage cartridge 1000, in the cloud. Furthermore, it may include some or all contents from the physical CM 1002 and/or visible indicator 1004.

Additionally, when the cloud link is utilized for data storage drives which are part of a software-defined network (SDN) system, the cloud may be used to flexibly manage data storage drives, data storage cartridges, and any other associated equipment. In various embodiments, the cloud (or portions, components, apparatuses, etc., thereof) may be configured to manage and/or modify the directory structure (and hence contents of a data storage cartridge's directory or index), to track and/or monitor which data storage drive recorded which data so that drive-interchange tolerances may be eliminated during a read-ERP by ensuring that data is read from tape on the same data storage drive that recorded the data to the tape, to track and/or monitor some or all errors, to cross-correlate the errors across one or more groups or matrices of data storage drives at the cloud level to determine correlations therebetween instead of relying on a tedious data storage cartridge-to-data storage cartridge level, to use nearly unlimited directory capacity at the cloud-level and not being limited to a rigidly formatted smaller data format (such as 64 KB chip within the data storage cartridge's physical CM), etc.

In another embodiment, a visible indicator (such as the QR code) and/or a wirelessly accessible indicator (such as the RFID tag) may store the cloud link so that the cloud link may be used on data storage products which do not have local data storage predisposed for storing such information (such as a CM). For example, the cloud link may be stored for IBM™ BlueStore cylindrical tape-cartridges which are a miniature version of IBM™ MSS 3850 cylindrical tape-cartridges. Currently, there is no room for a CM in the BlueStore cylindrical tape-cartridge. Therefore, the inclusion of the cloud link would allow for data and information correlating to the individual BlueStore cylindrical tape-cartridges to be stored in the storage cloud while still being accessible via the individual BlueStore cylindrical tape-cartridges.

Figure 12:
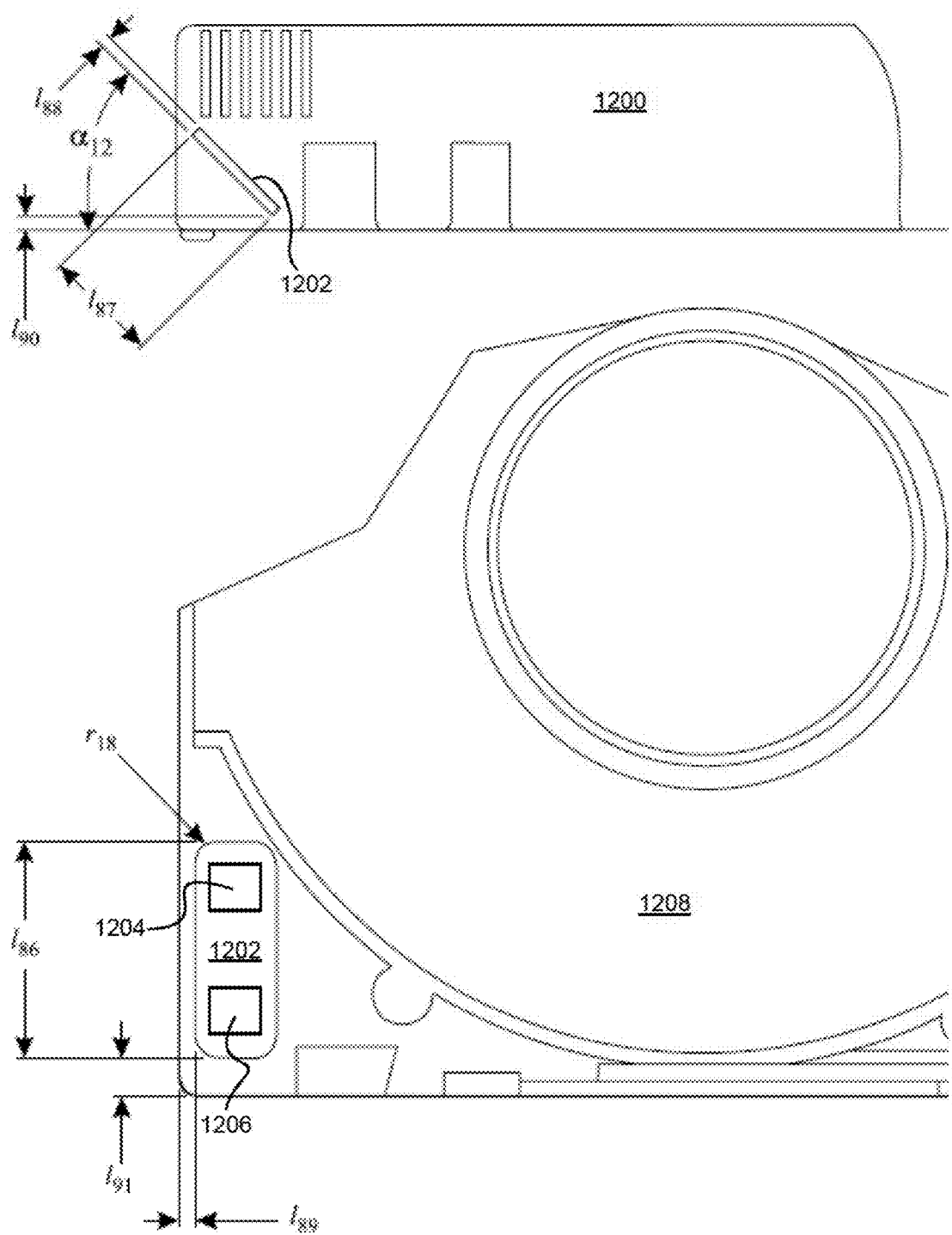
FIG. 12 shows portions of a data storage cartridge according to one embodiment.

With reference to FIG. 12, portions of a data storage cartridge 1200 are shown from a side view (upper view) and a portion of a cross-sectional top view (lower view), according to one embodiment. In the Figure, the data storage cartridge 1200 is a tape cartridge which houses a tape 1208 on a reel within the data storage cartridge 1200. In this embodiment, the CM 1202 may be implemented as a RFID tag, which may have a thickness of $l_{88}$, a width of $l_{87}$, a length of $l_{86}$. Furthermore, the RFID-enabled CM 1202 may be positioned a distance of $l_{89}$ from the rear edge of the data storage cartridge 1200, a distance of $l_{91}$ from the side edge of the data storage cartridge 1200, and a distance of $l_{90}$ from the bottom edge of the data storage cartridge 1200. As shown, the RFID-enabled CM 1202 may be oriented at an angle $\alpha_{12}$ relative to a rear surface of the data storage cartridge 1200, with the corners of the RFID-enabled CM 1202 possibly being rounded with a radius of curvature of rig, in one approach. The actual measurements of any of the distances, angles, and/or radius of curvature may be determined considering parameters of the data storage cartridge 1200, such as an available space within the data storage cartridge 1200, a proximity required for communication with the RFID-enabled CM 1202, etc.

According to one embodiment, the RFID-enabled CM 1202 may be located closer to a rear surface than a front surface of the data storage cartridge 1200 and may be angled relative to the rear surface of the data storage cartridge 1200 by an angle $\alpha_{12}$ between about 30° and about 60°, such as about 45°.

In one embodiment, linear dimension $r_{18}$ may be in a range of about 2 mm-3 mm, such as about 2.5 mm; $l_{86}$ may be in a range of about 15 mm-25 mm, such as about 20 mm; $l_{87}$ may be in a range of about 8-12 mm, such as about 10 mm; $l_{88}$ may be in a range of about 0.5-1.5 mm, such as about 0.8 mm; $l_{89}$ may be in a range of about 1-2 mm, such as about 1.5 mm; $l_{90}$ may be in a range of about 1-2 mm, such as about 1.5 mm, and $l_{91}$ may be in a range of about 3-7 mm, such as about 5 mm.

In this way, an accessor and a data storage drive may both be positioned, when normally interacting with the data storage cartridge 1200, to read the RFID-enabled CM 1202 utilizing a RFID reader or some other device capable of extracting the data stored to the RFID-enabled CM 1202 therefrom. In one embodiment, the data stored in the RFID-enabled CM 1202 may include the cloud link 1204 which points to a (virtual) cloud CM corresponding to the data storage cartridge 1200, and a unique identifier 1206, such as a Cloud Data Management Interface (CDMI™) Globally-Unique Object Identifier, which is also stored in the cloud CM at the location pointed to by the cloud link 1204. The reason for using the same CDMI Globally-Unique Object Identifier is that the physical CM 1202 is an extension of the cloud CM corresponding to the data storage cartridge 1200, and vice-versa. The only discernible difference between operating in the CM 1202 and the cloud CM is the memory format; however, a boundary between the CM 1202 and the cloud CM is transparent and seamless to the user.

A CDMI Globally-Unique Object Identifier is described in one approach in Storage Networking Industry Association (SNIA) Technical Position, *Cloud Data Management Interface (CDMI™)*, version 1.0.2 (Jun. 4, 2012) at section 5.10, page 32. The advantage of using the cloud CM is that the memory size is unlimited in the storage cloud, and information that is not possible to store in the physical CM 1202 (due to acute space limitations) may be stored to the cloud CM, such as the entire tape guiding IntegOut versus tape position graph from beginning of tape (BOT) to middle of tape (MOT) to end of tape (EOT), a complete history of read errors, which data storage drive was used for writing the data storage cartridge, a temperature and a humidity within the tape library and/or within the data storage cartridge and/or within the data storage drive at the time the data storage cartridge was written, etc.

According to one embodiment, advantages of having cloud-based CMs include a remote system administrator being capable of scanning across the population of data storage cartridges without having to either (a) physically mount the cartridge in a drive or (b) physically load the data storage cartridge in the library's accessor. By scanning across all data storage cartridges, those data storage cartridges having excessive stack shifts may be found, or excessive temporary read errors, or those cartridges may be identified which may have their data migrated to newer, better data storage cartridges, before a permanent (unrecoverable) read error develops, etc.

According to another embodiment, N+1 data storage cartridges may be written, where N=1 for a simple backup and N=2 for RAID-1. By writing N+1 data storage cartridges in a geoplex, the cloud CMs for each data storage cartridge may be queried and the best "N" data storage cartridges based on fewest write-verify errors and fewest stack shifts may be chosen for the storage of the data, and the data storage cartridge determined to not be the "best" may be cycled back to a "scratch tape" pool for use in other writing operations. If the data storage cartridge determined to not be the "best" experienced too many write-verify errors or stack shifts (above a predetermined threshold of each type, alone or in combination), that data storage cartridge may be removed from the tape library, examined, and possibly scrapped. Because a geoplex is involved, the performance comparison of the N+1 data storage cartridges is enabled by the cloud CM and the cloud CM being linked to the physical CM.

Because the physical CM is linked to the storage cloud, additional embodiments are possible. One such embodiment is to use Google Cloud Messaging (GCM) which permits a 4 KB data-payload. Thus, GCM may write information to the physical CM from the storage cloud. With GCM, every "message with payload" is considered non-collapsible, and the payload the message contains may be up to 4 KB, much less than the physical CM, which typically has a 64 KB storage capacity.

For example, the script below shows a JavaScript Object Notation (JSON)-formatted message in an Instant Messaging (IM) application in which the data storage cartridge passed its parity check:

```
{
"registration_id" :
"APA91bHun4MxP5egoKMwt2KZFBaFUH-1RYqx...",
"data" : {
"Tape_VOLSER"
"Text" : "Cartridge Passed its Parity Check on August 7, 2013.",
"Room" : "Tape Library 127",
},
}
```

Actual code may be included in the exemplary data section, instead of a text-message, such as a small code patch, etc., as would be known to one of skill in the art.

In another embodiment, Advanced Message Queuing Protocol (AMQP) may be used with the storage cloud link to the physical CM. AMQP is an open standard application layer protocol which permits the writing of information to the physical CM from the storage cloud.

In yet another embodiment, one or more applications that enable social media may be used to message to the physical CM. In one example, #tape_volser (indicating the data storage cartridge volume serial number) may be used in Twitter™ to "friend" the specific tape physical CM and thus allow 140 character status or code-patch tweets (messages) to be sent to the physical CM from the storage cloud via the Internet.

The storage cloud may, in one embodiment, enable IBM Customer Engineers and/or IBM Product Engineers (or any other suitable technicians, engineers, computer programmers, etc.), who administer the account and ferret-out/resolve customer problems to interact with the tape library and resolve any issues with storage cloud/physical CM links. This allows for a seamless experience for a user so that SDN may be used with tape, hard disk, optical disk, and/or solid-state memory removable-media cartridges, by use of a link in the various physical CMs to the storage cloud.

Figure 13:
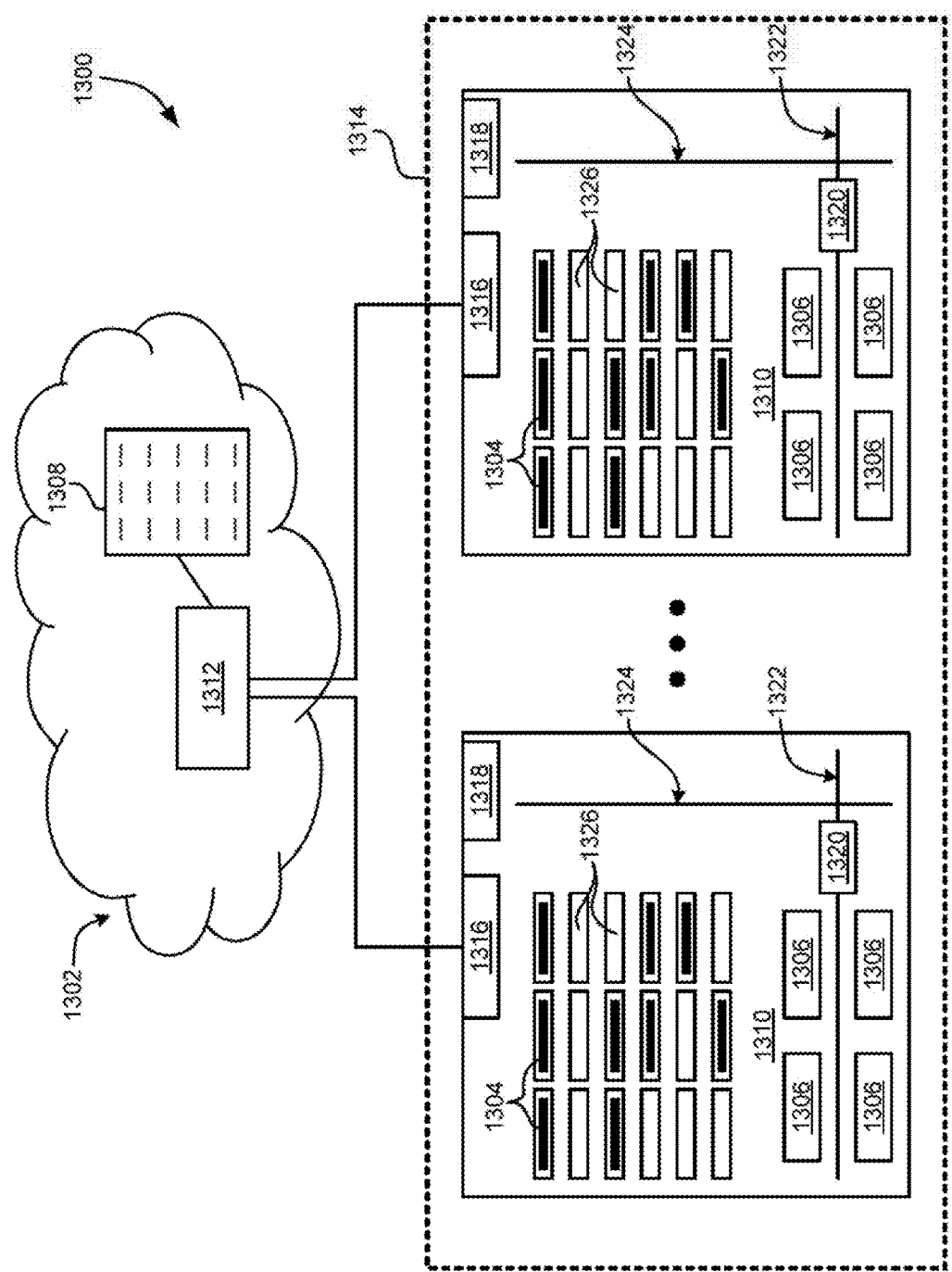
FIG. 13 shows a system according to one embodiment.

Furthermore, in more embodiments, other forms of storage may be improved by utilizing a control unit in the storage cloud. Now referring to FIG. 13, a system 1300 is shown according to one embodiment. The system 1300 comprises a storage cloud 1302 and one or more data storage libraries 1310, each data storage library comprising a plurality of data storage cartridges 1304 and data storage drives 1306.

The storage cloud 1302 comprises storage media, a storage controller 1312 and, a CM database 1310 stored to the storage media. In conventional systems, a storage controller resided in each tape library 1310. However, with the storage controller 1312 being located in the storage cloud 1302, the storage controller 1312 may control one or more data storage libraries 1310 as a single logical library 1314, even though the collection of component libraries themselves are isolated physical entities. The logical library 1314 may be a multi-media collection of data storage libraries 1310, with some data storage libraries 1310 holding data storage cartridges (like tape cartridges), some data storage libraries 1310 holding optical disk, DVD, or BluRay cartridges, some data storage libraries 1310 holding solid-state drives (SSDs), and some data storage libraries 1310 being virtual tape libraries. Of course, any combination of data storage libraries 1310 and/or media types may be used in the embodiments described herein according to various embodiments.

Each data storage library 1310 has a cloud interface 1316 which uses a communication protocol standard, such as the CDMI standard, Fiber Channel over Ethernet (FCoE), Giga-Bit EN, etc., that allows for bi-directional communications with the storage controller 1312 in the storage cloud 1302. The physical I/O mailslot 1318 is configured for data storage cartridges 1304 to be inserted and removed from the correlating data storage library 1310, while one or more accessors 1320 move horizontally on at least one rail 1322, and vertically on at least one additional rail 1324, in order to move data storage cartridges 1304 between storage slots 1326 and data storage drives 1306. As shown, there is no controller in any of the data storage libraries 1310, but a tape library controller may be included in one or more data storage libraries 1310 which communicates with the storage controller 1312.

The CM database 1308 comprises, in one embodiment, a plurality of entries, each entry corresponding to one data storage cartridge 1304. Each entry may comprise, in one approach, the unique identifier corresponding to the data storage cartridge 1304, the cloud link corresponding to the data storage cartridge 1304, and/or the location where the cloud CM is located for the corresponding data storage cartridge 1304.

By having the CM database 1310 in the storage cloud 1302, all of the data storage cartridges 1304 with their physical CMs 1328 linked to the storage cloud 1302 may now be seen and managed at the cloud level, across a plurality of data storage libraries 1310, regardless of storage media type. In addition to a link to the storage cloud 1302, each physical CM 1328 may also store a unique identifier 1330 describing which type of content it holds (MPEG video, JPEG images, DVD, BluRay, Payroll, Medical, Financial, etc.), so that the CM database 1310 may use its relational-database capability to sort the data storage cartridges 1304 for a system administrator or some other user by content (and not just by VOLSER), in one embodiment.

Also, the CM database 1310 may further sort cartridges by media type (tape, optical, SSD), age, number of uses, format, model, write error rate, read error rate, tape stack jumps, etc., to indicate which data storage cartridges 1304 should/may be replaced/repaired and/or removed from service. Each of the various details described above may also be identified in a corresponding physical CM 1328, in one approach.

Additionally, for a RAID-1 mirror (for example), the storage controller 1312 may determine in which physical data storage library 1310 a particular data storage cartridge 1304 is located and choose a data storage library 1310 with a free data storage drive 1306, or a shorter workload queue, or a lower picker utilization with which to load the data storage cartridge 1304. This would be particularly valuable for managing a library GEOPLEX, where the tape libraries are physically distributed to mitigate the effects of disasters such as hurricanes, tornadoes, fires, earthquakes, etc.

In another example, Scale Out Network Attached Storage (SONAS) has a plurality of interfaces that make it ubiquitous; however, that places a tremendous burden on development to provide and keep current all of these numerous and complex interfaces current. By taking the SONAS controller out of the SONAS box and placing it in the storage cloud with the SONAS box having a cloud interface, the SONAS box only needs to know "cloud-speak" (such as CDMI) so that users may access SONAS through the cloud using any supported communication technique known in the art and supported by the storage cloud. This dramatically lowers the development cost to produce and maintain storage.

This (using a storage cloud controller instead of localized controllers at each library) may also be applied for various storage solutions conventionally available, such as single box storage systems, blade storage racks, optical disk libraries, solid state disk libraries, etc.

Also, by moving a controller for a switch from the switch box and locating it in the storage cloud while providing a cloud-interface for the switch, the storage cloud may manage a data transfer fabric to optimize throughput of data system-wide, disable noisy links, and replace those links by other links in other switches by treating all of the switches as one massive switching complex which is entirely cloud-controlled.

Figure 14:
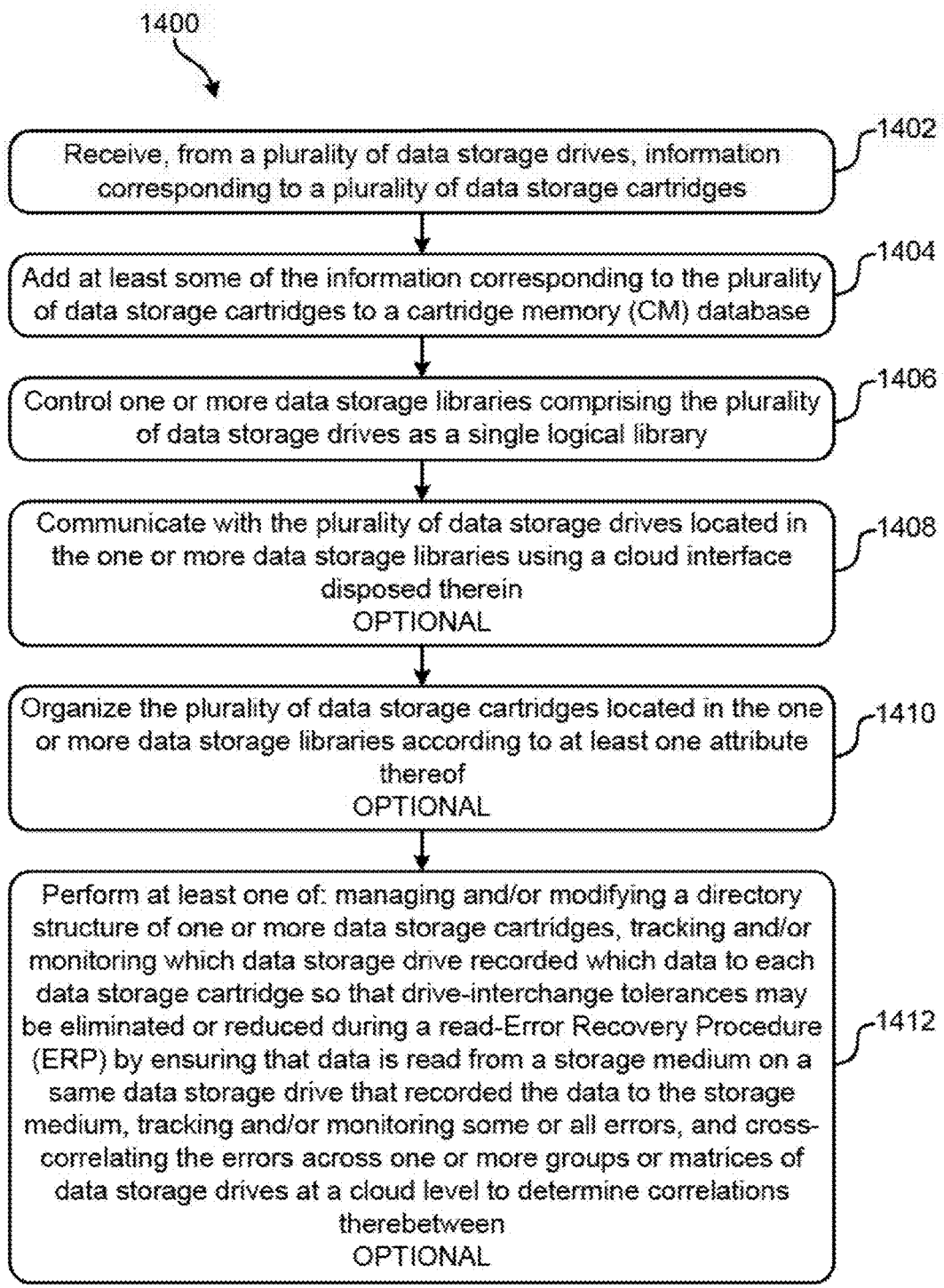
FIG. 14 is a flowchart of a method according to one embodiment.

Now referring to FIG. 14, a flowchart of a method 1400 for providing cloud-based control of a data storage system is shown, according to one embodiment. The method 1400 may be performed in accordance with the present invention in any of the environments depicted in FIGS. 1-13, among others, in various embodiments. Of course, more or less operations than those specifically described in FIG. 14 may be included in method 1400, as would be understood by one of skill in the art upon reading the present descriptions.

Each of the steps of the method 1400 may be performed by any suitable component of the operating environment. For example, in various embodiments, the method 1400 may be partially or entirely performed by one or more of a data storage drive (such as a tape drive, optical disk drive, HDD, etc.), a switch, a cloud controller, a router, a virtual switch operating on a virtualization platform, a host, a server, a processor (such as an ASIC, a FPGA, a CPU, etc.) embodied in a computer or device, etc.

As shown in FIG. 14, method 1400 may initiate with operation 1402, where information corresponding to a plurality of data storage cartridges is received from a plurality of data storage drives. The plurality of data storage drives may be located in one or more data storage libraries which may be located remote or local to one another.

The information corresponding to the plurality of data storage cartridges may comprise, in various approaches, a directory and/or index for each data storage cartridge, some or all meta-data relevant to each data storage cartridge, some or all contents from each physical CM, some or all contents from each visible indicator, each unique identifier, an entire tape guiding motion versus tape position graph for each data storage cartridge, a complete history of read errors for each data storage cartridge, which data storage drive was used for writing each data storage cartridge, a temperature and a humidity within each tape library, each data storage cartridge, and/or each data storage drive at a time when each data storage cartridge was written, etc.

In operation 1404, at least some of the information corresponding to the plurality of data storage cartridges is added to a cartridge memory (CM) database.

In one embodiment, adding the information corresponding to the plurality of data storage cartridges to the CM may comprise storing and/or updating a plurality of entries of the CM database, each entry corresponding to a data storage cartridge.

Furthermore, in some approaches, each entry may comprise a unique identifier for each data storage cartridge and a cloud link for each data storage cartridge which points to a location where a cloud CM is located for each data storage cartridge. The cloud CM is stored in a storage cloud and is configured to act as an extension of the physical CM of each data storage cartridge. Also, the unique identifier may be a Cloud Data Management Interface (CDMI) Globally-Unique Object Identifier.

In operation 1406, one or more data storage libraries comprising the plurality of data storage drives are controlled as a single logical library. In this way, the complex many library infrastructure may be managed by a single controller on the cloud-level.

In optional operation 1408, the plurality of data storage drives located in the one or more data storage libraries are communicated with using a cloud interface disposed therein.

In optional operation 1410, the plurality of data storage cartridges located in the one or more data storage libraries are organized according to at least one attribute thereof.

Any suitable attribute may be used, such as those described herein and those known in the art, including but not limited to: contents of at least one data storage cartridge, a type of at least one data storage cartridge, an age of at least one data storage cartridge, a usage of at least one data storage cartridge, etc.

In optional operation 1412, at least one of the following actions is performed: managing and/or modifying a directory structure of one or more data storage cartridges, tracking and/or monitoring which data storage drive recorded which data to each data storage cartridge so that drive-interchange tolerances may be eliminated or reduced during a read-ERP by ensuring that data is read from a storage medium on a same data storage drive that recorded the data to the storage medium, tracking and/or monitoring some or all errors, and cross-correlating the errors across one or more groups or matrices of data storage drives at a cloud level to determine correlations therebetween. Of course, many other relevant actions may also be performed using the information exchanged between the plurality of data storage drives, data storage cartridges, and data storage libraries.

Method 1400 may be performed by a system, apparatus, computer program product, or in any other way known in the art. In one such embodiment, a system (such as a storage system or storage subsystem, computer, management controller, storage controller, etc.) may include a processor (such as a microprocessor, CPU, ASIC, FPGA, etc.) and modules, code, and/or logic (soft or hard) integrated with and/or executable by the processor to execute the steps of the method 1400 or portions thereof. In another embodiment, a computer program product may include a computer readable storage medium having program code embodied therewith, the program code readable/executable by a processor to execute the method 1400 or portions thereof.

It will be clear that the various features of the foregoing systems and/or methodologies may be combined in any way, creating a plurality of combinations from the descriptions presented above.

In one embodiment, a computer program product for providing cloud-based control of a data storage system includes a computer readable storage medium having program code embodied therewith. The program code is readable and/or executable by a processor to: receive, from a plurality of data storage drives, information corresponding to a plurality of data storage cartridges, add at least some of the information corresponding to the plurality of data storage cartridges to a CM database, control one or more data storage libraries comprising the plurality of data storage drives as a single logical library, communicate with the plurality of data storage drives located in the one or more data storage libraries using a cloud interface disposed therein, and organize the plurality of data storage cartridges located in the one or more data storage libraries according to at least one attribute thereof.

A data processing system suitable for storing and/or executing program code may include at least one processor, which may be or be part of a controller, coupled directly or indirectly to memory elements through a system bus, such as processor 400 of FIG. 4. The memory elements can include local memory employed during actual execution of the program code, such as nonvolatile memory 404 of FIG. 4, bulk storage, and cache memories which provide temporary storage of at least some program code in order to reduce the number of times code must be retrieved from bulk storage during execution.

It will be further appreciated that embodiments of the present invention may be provided in the form of a service deployed on behalf of a customer. Those of skill in the art will understand that changes may be made with respect to the methods discussed above, including changes to the ordering of the choices of the methods of FIG. 14. Further, those of skill in the art will understand that differing specific component arrangements may be employed than those illustrated herein.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:
1. A system, comprising:
a storage cloud comprising storage media, a cartridge memory (CM) database stored to the storage media, and a storage controller,
wherein the storage controller is configured to:
communicate with one or more data storage drives located in one or more data storage libraries, each data storage drive being configured to write and/or read data to/from a plurality of data storage cartridges therein; and
control the one or more data storage libraries as a single logical library using the CM database,
wherein the CM database comprises a plurality of entries, each entry of the CM database corresponding to a data storage cartridge and configured to comprise data selected from a group comprising: a unique identifier for a corresponding data storage cartridge, and a cloud link pointing to a location where a cloud CM is located for the corresponding data storage cartridge,
wherein the cloud CM is an extension of a physical CM of the corresponding data storage cartridge, and wherein the unique identifier is a Cloud Data Management Interface (CDMI) Globally-Unique Object Identifier.

2. The system as recited in claim 1, wherein each data storage cartridge comprises:
a housing configured to store a data storage medium, the data storage medium being configured to store more than about 100 MB of data;
a physical CM configured to store less than about 100 KB of data; and
a visible indicator displayed on an exterior of the housing, the visible indicator providing at least a cloud link to a location within the storage cloud and a unique identifier.

3. The system as recited in claim 1, wherein the storage cloud stores information corresponding to each of the plurality of data storage cartridges, the information being selected from a group comprising: a directory and/or index for each data storage cartridge, some or all meta-data relevant to each data storage cartridge, some or all contents from each physical CM, some or all contents from each visible indicator, each unique identifier, an entire tape guiding IntegOut versus tape position graph for each data storage cartridge, a complete history of read errors for each data storage cartridge, which data storage drive was used for writing each data storage cartridge, a temperature and a humidity within each tape library, a temperature and a humidity within each data storage cartridge, and a temperature and a humidity within each data storage drive at a time when each data storage cartridge was written.

4. The system as recited in claim 1, wherein the storage controller is further configured to: manage and/or modify a directory structure of one or more data storage cartridges, track and/or monitor which data storage drive recorded which data to each data storage cartridge so that drive-interchange tolerances may be eliminated or reduced during a read-Error Recovery Procedure (ERP) by ensuring that data is read from a storage medium on a same data storage drive that recorded the data to the storage medium, track and/or monitor some or all errors, and cross-correlate the errors across one or more groups of data storage drives at a cloud level to determine correlations therebetween.

5. A data storage cartridge, comprising:
a housing configured to store a data storage medium, the data storage medium being configured to store more than about 100 MB of data;
a physical cartridge memory (CM) configured to store less than about 100 KB of data; and
a visible indicator displayed on an exterior of the housing, the visible indicator providing at least a cloud link to a location within a storage cloud and a unique identifier, wherein the unique identifier is a Cloud Data Management Interface (CDMI) Globally-Unique Object Identifier.

6. The data storage cartridge as recited in claim 5, further comprising a wirelessly-accessible apparatus coupled to and/or located within the housing, the wirelessly-accessible apparatus being configured to transmit and/or provide the cloud link.

7. The data storage cartridge as recited in claim 6, wherein the wirelessly-accessible apparatus comprises at least one of: a radio frequency identification (RFID) tag, a near field communication (NFC) chip, and a radio frequency (RF) transmitter.

8. The data storage cartridge as recited in claim 7, wherein the wirelessly-accessible apparatus is located closer to a rear surface than a front surface of the data storage cartridge and angled relative to the rear surface of the data storage cartridge by an angle between about 30° and about 60°.

9. The data storage cartridge as recited in claim 5, wherein the visible indicator comprises at least one of: an alphanumeric string, a bar code, and a quick response (QR) code.

10. The data storage cartridge as recited in claim 5, wherein the location within the storage cloud is configured to store information corresponding to the data storage cartridge as an extension of the physical CM, the information comprising at least one of: a directory and/or index of the data storage cartridge, some or all meta-data relevant to the data storage cartridge, some or all contents from the physical CM, some or all contents from the visible indicator, the unique identifier, an entire tape guiding IntegOut versus tape position graph, a complete history of read errors, which data storage drive was used for writing the data storage cartridge, a temperature and a humidity within a tape library, the data storage cartridge, and/or a data storage drive at a time when the data storage cartridge was written.

11. A method, comprising:
receiving, from a plurality of data storage drives, information corresponding to a plurality of data storage cartridges;
adding at least some of the information corresponding to the plurality of data storage cartridges to a cartridge memory (CM) database by storing a plurality of entries to the CM database, each entry of the CM database corresponding to a data storage cartridge and indicating the at least some of the information selected from a group comprising: a unique identifier for a corresponding data storage cartridge, and a cloud link pointing to a location where a cloud CM is located for the corresponding data storage cartridge, wherein the unique identifier is a Cloud Data Management Interface (CDMI) Globally-Unique Object Identifier; and
controlling one or more data storage libraries comprising the plurality of data storage drives as a single logical library using the CM database.

12. The method as recited in claim 11, wherein the cloud CM is stored in a storage cloud and is configured to act as an extension of a physical CM of each data storage cartridge.

13. The method as recited in claim 11, wherein the information corresponding to the plurality of data storage cartridges is selected from a group comprising: a directory and/or index for each data storage cartridge, some or all meta-data relevant to each data storage cartridge, some or all contents from each physical CM, some or all contents from each visible indicator, each unique identifier, an entire tape guiding IntegOut versus tape position graph for each data storage cartridge, a complete history of read errors for each data storage cartridge, which data storage drive was used for writing each data storage cartridge, a temperature and a humidity within each tape library, a temperature and a humidity within each data storage cartridge, and a temperature and a humidity within each data storage drive at a time when each data storage cartridge was written.

14. The method as recited in claim 11, further comprising communicating with the plurality of data storage drives located in the one or more data storage libraries using a cloud interface disposed therein.

15. The method as recited in claim 14, further comprising organizing the plurality of data storage cartridges located in the one or more data storage libraries according to at least one attribute thereof.

16. The method as recited in claim 15, wherein the at least one attribute is selected from a group comprising: contents of at least one data storage cartridge, a type of at least one data storage cartridge, an age of at least one data storage cartridge, and a usage of at least one data storage cartridge.

17. The method as recited in claim 11, further comprising performing a task selected from a group consisting: managing and/or modifying a directory structure of one or more data storage cartridges, tracking and/or monitoring which data storage drive recorded which data to each data storage cartridge so that drive-interchange tolerances may be eliminated or reduced during a read-Error Recovery Procedure (ERP) by ensuring that data is read from a storage medium on a same data storage drive that recorded the data to the storage medium, tracking and/or monitoring some or all errors, and cross-correlating the errors across one or more groups or matrices of data storage drives at a cloud level to determine correlations therebetween.

18. A computer program product for providing cloud-based control of a data storage system, the computer program product comprising a computer readable storage medium having program code embodied therewith, the program code readable and/or executable by a processor to:
 receive, from a plurality of data storage drives, information corresponding to a plurality of data storage cartridges;
 add at least some of the information corresponding to the plurality of data storage cartridges to a cartridge memory (CM) database by storing a plurality of entries to the CM database, each entry of the CM database corresponding to a data storage cartridge and comprising data selected from a group comprising: a unique identifier for each data storage cartridge, and a cloud link for each data storage cartridge which points to a location where a cloud CM is located for each data storage cartridge,
wherein the cloud CM is stored in a storage cloud and is configured to act as an extension of a physical CM of each data storage cartridge, and wherein the unique identifier is a Cloud Data Management Interface (CDMI) Globally-Unique Object Identifier;
control one or more data storage libraries comprising the plurality of data storage drives as a single logical library using the CM database;
communicate with the plurality of data storage drives located in the one or more data storage libraries using a cloud interface disposed therein; and
organize the plurality of data storage cartridges located in the one or more data storage libraries according to at least one attribute thereof.

* * * * *